(12) United States Patent
Nakamura

(10) Patent No.: US 7,791,256 B2
(45) Date of Patent: *Sep. 7, 2010

(54) MULTI-LAYER PIEZOELECTRIC ELEMENT

(75) Inventor: Shigenobu Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 909 days.

This patent is subject to a terminal disclaimer.

(21) Appl. No.: 10/573,238

(22) PCT Filed: Sep. 22, 2004

(86) PCT No.: PCT/JP2004/013797

§ 371 (c)(1), (2), (4) Date: Oct. 12, 2006

(87) PCT Pub. No.: WO2005/029602

PCT Pub. Date: Mar. 31, 2005

(65) Prior Publication Data

US 2007/0176521 A1    Aug. 2, 2007

(30) Foreign Application Priority Data

Sep. 24, 2003 (JP) ............................. 2003-332020
Dec. 18, 2003 (JP) ............................. 2003-421146

(51) Int. Cl.
H01L 41/047 (2006.01)
(52) U.S. Cl. ................... 310/364; 310/365; 310/328
(58) Field of Classification Search ............ 310/328, 310/363–366
See application file for complete search history.

(56) References Cited

U.S. PATENT DOCUMENTS

| 5,163,209 A | 11/1992 | Harada et al. |
| 5,196,757 A * | 3/1993 | Omatsu .................. 310/358 |
| 6,252,481 B1 | 6/2001 | Iwao et al. |
| 6,381,118 B1 | 4/2002 | Yokoyama et al. |

(Continued)

FOREIGN PATENT DOCUMENTS

CN    1080109 A    12/1993

(Continued)

OTHER PUBLICATIONS

European Search Report for corresponding European application 04787980.4-2222 lists the references above.

(Continued)

Primary Examiner—J. SanMartin
(74) Attorney, Agent, or Firm—Hogan Lovells US LLP

(57) ABSTRACT

A multi-layer piezoelectric element of high durability wherein the internal electrodes and the external electrodes do not break even when operated continuously over a long period of time under high electric field and high pressure is provided. The first multi-layer piezoelectric element according to the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, and the external electrodes include an electrically conductive material and glass and is formed from a porous electrically conductive material that has a three-dimensional mesh structure.

12 Claims, 7 Drawing Sheets

U.S. PATENT DOCUMENTS

| | | |
|---|---|---|
| 6,396,201 B1 | 5/2002 | Ide et al. |
| 6,414,417 B1 | 7/2002 | Tsuyoshi et al. |
| 6,507,140 B1 | 1/2003 | Heinz et al. |
| 6,522,052 B2 | 2/2003 | Kihara et al. |
| 6,663,015 B2 | 12/2003 | Yamada et al. |
| 6,700,311 B2 * | 3/2004 | Hammer et al. ............. 310/363 |
| 6,756,720 B2 | 6/2004 | Sakai |
| 7,056,443 B2 * | 6/2006 | Sasaki et al. .................. 216/18 |
| 7,439,655 B2 * | 10/2008 | Asano et al. ................ 310/328 |
| 7,498,727 B2 * | 3/2009 | Nakamura et al. .......... 310/366 |
| 2001/0047796 A1 | 12/2001 | Yamada et al. |
| 2002/0043901 A1 | 4/2002 | Kihara et al. |
| 2003/0141786 A1 | 7/2003 | Sakai |
| 2004/0129919 A1 * | 7/2004 | Horikawa et al. ...... 252/62.9 PZ |
| 2005/0255239 A1 * | 11/2005 | Zhu et al. ................... 427/226 |
| 2006/0003151 A1 * | 1/2006 | Sasaki ........................ 428/209 |
| 2006/0043844 A1 * | 3/2006 | Hammer-Altmann et al. .......................... 310/358 |
| 2007/0069610 A1 * | 3/2007 | Ono et al. ................... 310/328 |
| 2007/0273251 A1 * | 11/2007 | Okamura et al. ............ 310/364 |
| 2007/0278907 A1 * | 12/2007 | Kondo et al. ................ 310/364 |
| 2009/0236945 A1 * | 9/2009 | Yamamoto et al. .......... 310/358 |

FOREIGN PATENT DOCUMENTS

| | | | |
|---|---|---|---|
| CN | 1435899 A | 8/2003 | |
| JP | 60-99522 | 7/1985 | |
| JP | 61-133715 | 6/1986 | |
| JP | 63285982 A | 11/1988 | |
| JP | 1-130568 | 9/1989 | |
| JP | 03296205 A | 12/1991 | |
| JP | 11162771 A | 6/1999 | |
| JP | 2000-040635 | 2/2000 | |
| JP | 2000-077733 | 3/2000 | |
| JP | 2000164455 A | 6/2000 | |
| JP | 2000340849 A | 12/2000 | |
| JP | 2001210886 A | 8/2001 | |
| JP | 2001250740 A | 9/2001 | |
| JP | 2001308402 A | 11/2001 | |
| JP | 2001342062 A | 12/2001 | |
| JP | 2001-342062 | 12/2002 | |
| JP | 2002367859 A | 12/2002 | |
| JP | 2003086853 A | 3/2003 | |
| JP | 2003197991 A | 7/2003 | |
| JP | 2004103621 A | 4/2004 | |
| JP | 2005072325 A | 3/2005 | |
| WO | 0193345 A1 | 12/2001 | |

OTHER PUBLICATIONS

English translation of Chinese office action for corresponding Chinese application No. 200480027657.1 lists the references above.

English translation of Chinese office action for corresponding Chinese application No. 200480027658.6 lists the references above.

Chinese language office action and its English language translation for corresponding Chinese application 200480027657.1 lists the references above.

Chinese language office action and its English language translation for corresponding Chinese application 2008101903503 lists the references above.

Japanese language office action and its English language translation for corresponding Japanese application 2003301189 lists the references above.

European search report dated May 27, 2010 for corresponding European application No. 08167806.2 lists the references above, May 27, 2010.

English translation of Chinese office action for corresponding Chinese application No. 200480027657.1 lists the references above, May 9, 2008.

English translations of Chinese office action for corresponding Chinese application No. 200480027658.6 lists the references above, May 9, 2008.

Chinese language office action and its English language translation for corresponding Chinese application 200480027657.1 lists the refences above, Aug. 28, 2009.

Chinese language office action and its English language translation for corresponding Chinese application 2008101903503 lists the references above.

Japanese language office action and its English language translation for corresponding Japanese application 2003301189 lists the references above, Dec. 1, 2009.

European Search Report for corresponding European application 04787980.4-2222 lists the references above, Jan. 16, 2008.

* cited by examiner

MULTI-LAYER PIEZOELECTRIC ELEMENT

FIELD OF THE INVENTION

The present invention relates to a multi-layer piezoelectric element and an injection apparatus, for example, piezoelectric transducer, fuel injection apparatus of automobile engine, and multi-layer piezoelectric actuator used as a drive unit in precision positioning device or vibration preventing device for an optical apparatus.

BACKGROUND ART

Multi-layer piezoelectric actuators constituted from piezoelectric layers and internal electrodes stacked alternately one on another have been known as an example of the multi-layer piezoelectric element. The multi-layer piezoelectric actuators can be divided into two categories: fired-at-once type and stacked type that comprises piezoelectric porcelain and internal electrode sheet stacked alternately one on another. When the requirements to reduce the operating voltage and the manufacturing cost are taken into consideration, the multi-layer piezoelectric actuator of fired-at-once type has been recognized to be more advantageous for the reason of smaller layer thickness.

FIG. 6 shows a multi-layer piezoelectric actuator of the prior art. This actuator comprises a stack 53 formed by stacking the piezoelectric layers 51 and the internal electrodes 52 alternately. Placed on both ends of the stack in the direction of stacking are inactive layers 55. The internal electrodes 52 are formed so that one end thereof is exposed at the side face of the stack 53 on the right hand side in one layer and on the left hand side in the next layer, and an external electrode 70 is formed on the side face of the stack 53 where the end of the internal electrode 52 is exposed. The other end of the internal electrode 52 is covered by an insulating material 61 so as to be insulated from the external electrode 70.

The multi-layer piezoelectric actuator of fired-at-once type has been manufactured by stacking a predetermined number of ceramic green sheets formed from a calcined powder of piezoelectric material and an organic binder, with an internal electrode paste made by mixing a silver-palladium powder and a binder being printed on the ceramic green sheets, thereby forming a green compact from the stack, and firing the green compact after removing the organic materials by heating to a predetermined temperature.

The piezoelectric material of the prior art requires a temperature in a range from 1200 to 1300° C. for firing, and accordingly silver-palladium with a high content of expensive palladium has been used to form the internal electrode. With the advancement in the technology of low temperature firing in recent years, piezoelectric materials that can be fired at a temperature around 1100° C. have been developed. With these piezoelectric materials, however, it has been necessary to use silver-palladium consisting of 70% by weight of silver and 30% by weight of palladium when the melting point of the internal electrode is taken into account.

The external electrode has been formed by using an electrically conductive paste consisting of 83 to 99% by weight of silver, 1 to 17% by weight of glass powder and an organic component, applying the paste on the side faces of the stack 53 and firing it at a temperature in a range from 500 to 1000° C. (refer to, for example, Patent Document 1).

Patent Document 1: Japanese Unexamined Patent Publication (Kokai) No. 2000-40635
Patent Document 2: Japanese Unexamined Utility Model Publication (Kokai) No. 60-99522
Patent Document 3: Japanese Unexamined Patent Publication (Kokai) No. 61-133715
Patent Document 4: Japanese Unexamined Utility Model Publication (Kokai) No. 1-130568

DISCLOSURE OF THE INVENTION

Problems to be Solved by the Invention

The multi-layer piezoelectric actuator of the prior art has such problems that, when operated continuously over a long period of time under a high electric field and a high pressure, the external electrode 70 becomes unable to accommodate the expansion and contraction of the stack 53 and breaks, or continuity failure occurs between the external electrode 70 and the internal electrode 52, thus shutting off the current supply to part of the piezoelectric layers 51 and resulting in alteration of the displacement characteristic during operation.

In recent years, in order to achieve a large amount of displacement under a high pressure with a multi-layer piezoelectric actuator of smaller size, it is in practice to make continuous operation over a long period of time with a higher electric field applied. However, the external electrode 70 cannot be made flexible enough simply by applying and baking the electrically conductive paste on the side face of the stack 53, and the external electrode 70 becomes unable to follow the expansion and contraction of the stack 53 in the direction of stacking. Thus such failures occur as continuity failure or peel-off between the internal electrode 52 and the external electrode 70 or crack in the external electrode 70 that leads to breakage, thus shutting off the current supply to part of the piezoelectric layers 51 and resulting in alteration of the displacement characteristic during operation.

Moreover, there has been such a problem that use of the expensive palladium in a proportion as high as 30% by weight results in a high manufacturing cost.

Accordingly, an object of the present invention is to provide a multi-layer piezoelectric element and an injection apparatus of high durability wherein the internal electrodes and the external electrodes do not break even when operated continuously over a long period of time under high electric field and high pressure.

Means for Solving the Problems

A first multi-layer piezoelectric element according to the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, and the external electrodes include an electrically conductive material and glass and is formed from a porous electrically conductive material that has a three-dimensional mesh structure.

In the first multi-layer piezoelectric element described above, since the external electrodes include the electrically conductive material and glass and are formed from a porous electrically conductive material that has a three-dimensional mesh structure, the external electrodes are flexible in nature and can deform in conformity with the expansion and contraction of the actuator constituted from the stack in the direction of stacking during operation, thus making it possible to prevent the external electrode from breaking and contact failure from taking place between the internal electrode and the external electrode.

Thus according to the first multi-layer piezoelectric element of the present invention, the external electrodes can satisfactorily absorb the stress generated by the expansion and contraction of the stack, and therefore a multi-layer piezoelectric element of high reliability can be provided where the external electrodes and the internal electrodes can be prevented from breaking even when operated continuously at a high speed over a long period of time under high electric field and high pressure.

In the first multi-layer piezoelectric element of the present invention, it is preferable that the external electrodes are partially joined onto the first side face and the second side face. By joining the external electrodes partially onto the side faces of the stack, it is made possible to absorb the stress generated by the expansion and contraction of the stack more flexibly than in the case of joining over the entire surface.

Moreover, in the first multi-layer piezoelectric element of the present invention, it is preferable that the electrically conductive material of the external electrodes includes silver as the main component. The external electrodes formed from the electrically conductive material consisting of silver that has a low value of Young's modulus is capable of more flexibly absorbing the stress generated by the expansion and contraction of the stack. Also by making the electrically conductive material that constitutes the external electrodes from silver, it becomes easier to form diffusion junction with silver-palladium alloy that is commonly used as the electrically conductive material of the internal electrodes, thus connecting the external electrodes and the internal electrodes more firmly.

In the first multi-layer piezoelectric element of the present invention, it is also preferable that the softening point of the glass used in the external electrodes is not higher than the melting point of the electrically conductive material that constitutes the external electrodes. This makes it possible to set the baking temperature of the external electrodes at a temperature not higher than the melting point the electrically conductive material and not lower than the softening point of the glass, so that coagulation of the electrically conductive material can be prevented from occurring and bonding by the glass component with sufficient strength can be achieved.

In the first multi-layer piezoelectric element of the present invention, it is also preferable that the metal component of the internal electrode includes Ag as the main component and 15% by weight or less of at least one kind of the Pd and Pt group metals. When the internal electrode includes 15% by weight or less of at least one kind of the Pd and Pt group metals, difference in composition between the internal electrodes and the external electrodes can be made smaller so as to achieve better cross diffusion of metals between the internal electrodes and the external electrodes, thus resulting in higher reliability of the joint between the internal electrodes and the external electrodes and improvement in durability.

A second multi-layer piezoelectric element according to the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, the internal electrodes and the external electrodes include silver, while the proportions of silver in the internal electrodes and in the external electrodes are set so that the ratio of silver content X (% by weight) to the entire electrically conductive material included in the internal electrode and the ratio of silver content Y (% by weight) to the total weight of the electrically conductive material and glass included in the external electrodes satisfy conditions of $X \geqq 85$ and $0.9 \leqq X/Y \leqq 1.1$.

When the proportions of silver in the internal electrodes and in the external electrodes are set in such a manner as in the second multi-layer piezoelectric element, the use of expensive palladium can be reduced and it is made possible to manufacture the multi-layer piezoelectric element at a lower cost.

Also because the weight proportion of silver in the electrically conductive material that constitutes the internal electrode and the weight proportion of silver in the external electrode become substantially equal, cross diffusion of silver that is included in the external electrode and silver included in the internal electrode is accelerated when the external electrodes are bonded by baking onto the stack. This enables it to firmly bond the internal electrode and the external electrode, so that excellent durability is achieved such that the internal electrodes and the external electrodes do not break even when operated continuously over a long period of time under high electric field and high pressure.

Also in the second multi-layer piezoelectric element of the present invention, it is preferable that the internal electrodes include the piezoelectric material, and that the proportion Z (% by weight) of silver to the total weight of the internal electrode including the piezoelectric material satisfies condition of $0.7 \leqq Z/Y \leqq 1.0$.

By including the piezoelectric material in the internal electrodes described above, it is made possible to sinter the piezoelectric material at the same time the electrically conductive material included in the internal electrode is fired so as to improve the bonding strength of the internal electrodes and the piezoelectric material and improve the durability of the stack.

By setting the proportion Z (% by weight) of silver in the internal electrode so as to satisfy the condition of $0.7 \leqq Z/Y \leqq 1.0$, the weight proportion of silver in the electrically conductive material that constitutes the internal electrode and the weight proportion of silver in the external electrode become substantially equal, so that cross diffusion of silver that is included in the external electrode and silver included in the internal electrode is accelerated when the external electrodes are bonded by baking onto the stack, and therefore it is made possible to firmly join the internal electrode and the external electrode, so that the joint between the internal electrode and the external electrode do not break even when operated at a high speed.

In the second multi-layer piezoelectric element of the present invention, it is also preferable that the external electrodes are formed from a porous electrically conductive material that has a three-dimensional mesh structure. This makes the external electrodes flexible in nature and capable of deforming in conformity with the expansion and contraction of the stack in the direction of stacking during operation, thus making it possible to prevent the external electrode from breaking and contact failure from taking place between the internal electrodes and the external electrodes.

Also in the second multi-layer piezoelectric element of the present invention, it is preferable that the softening point (° C.) of the glass used in the external electrodes is not higher than ⅘ of the melting point (° C.) of the electrically conductive material that constitutes the internal electrodes.

When the softening point of the glass used in the external electrodes is set as described above, the external electrode can be bonded by baking at a temperature sufficiently lower than the melting point of the electrically conductive material that constitutes the internal electrode and is higher than the softening point of the glass. As a result, it is made possible to prevent the electrically conductive material in the internal electrode and in the external electrode from coagulating, and cause the electrically conductive material included in the internal electrode and the electrically conductive material included in the external electrode to fully bonded through diffusion, so that strong bonding can be achieved by the softened glass.

In the first and second multi-layer piezoelectric elements of the present invention, it is also preferable that void ratio of the external electrode is in a range from 30 to 70% by volume, in order to effectively absorb stress generated by the expansion and contraction of the stack during operation so that the external electrode can be prevented from breaking.

In the first and second multi-layer piezoelectric element of the present invention, it is also preferable that the glass that constitutes the external electrode is amorphous. When the glass that constitutes the external electrode is amorphous, it has Young's modulus of a value lower than that of a crystalline material and therefore cracks or other defects can be suppressed from occurring in the external electrodes.

A third multi-layer piezoelectric element according to the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while the internal electrodes are made of an electrically conductive material that includes silver as the main component and at least one of palladium and platinum as well, the external electrodes are constituted from an electrically conductive material consisting mainly of silver and glass, and the proportion of silver included in electrically conductive material of the internal electrode near the junction with the external electrode is higher than the proportion of silver included in the electrically conductive material of the internal electrode located inside of the stack.

In the multi-layer piezoelectric element of the present invention having the constitution described above, the connection between the electrically conductive material of the internal electrode and the electrically conductive material of the external electrode becomes secure and strong, thus preventing such a problem from occurring as the internal electrode and the external electrode come off at the junction thereof, even when operated continuously under a high electric field.

That is, as the proportion of silver included in the electrically conductive material of the internal electrode near the junction with the external electrode is set higher than the proportion of silver included inside of the stack in order to form a firm joint with the electrically conductive material of the external electrode that is formed mainly from silver, concentration of silver as the main component of the electrically conductive material of the external electrode and concentration of silver in the electrically conductive material of the internal electrode can be approximate to each other, thus making the junction between the internal electrode and the external electrode more secure through cross diffusion of silver.

In other words, since concentration of silver in the electrically conductive material of the external electrode and concentration of silver in the electrically conductive material of the internal electrode in a region near the junction with the external electrode are made approximately equal to each other, cross diffusion of silver included in the external electrode and silver included in the internal electrode is accelerated when the external electrode is bonded by baking onto the stack. This enables it to firmly join the internal electrode and the external electrode, so that excellent durability is achieved such that the internal electrode and the external electrode do not break even when operated continuously over a long period of time under high electric field and high pressure.

In the third multi-layer piezoelectric element of the present invention, it is preferable that the proportion of silver included in the electrically conductive material of the internal electrode becomes higher toward the external electrode. Since this arrangement results in a gradient of silver concentration that varies continuously, stable internal electrode and stable junction between the internal electrode and the external electrode can be achieved.

Also in the third multi-layer piezoelectric element of the present invention, it is preferable that a neck is formed in the joint between the internal electrode and the external electrode so as to achieve diffusion junction. Formation of the neck enables it to prevent spark or breakage from occurring in the joint between the internal electrode and the external electrode even when the device is operated at a high speed with a large electric current.

Also in the third multi-layer piezoelectric element of the present invention, it is preferable that the proportion of silver included in the electrically conductive material of the internal electrode is 85% by weight or higher. Such a high proportion of silver in the internal electrodes makes the junction thereof with the external electrode more secure through the diffusion of silver. The proportion of silver included in the electrically conductive material of the internal electrode refers to the proportion of silver within the stack where the proportion of silver included in the internal electrode does not vary.

Also in the third multi-layer piezoelectric element of the present invention, it is preferable that the glass component included in the external electrode substantially exists in a region not more than 80% in thickness of the external electrode on the side of the surface of the stack.

When the glass component included in the external electrode exists substantially in a region not more than 80% in thickness of the external electrode on the side of the surface of the stack, such a constitution of the external electrode can be obtained that substantially only the electrically conductive material that includes silver as the main component exists on the surface of the external electrode exposed to the atmosphere, thereby providing the external electrode surface that is satisfactorily wetted by solder when a lead wire is soldered onto the external electrode.

Also in the third multi-layer piezoelectric element of the present invention, it is also preferable that the glass component included in the external electrode includes lead oxide or bismuth oxide. The external electrode can be joined more firmly with the piezoelectric material when the glass component of the external electrode includes lead oxide or bismuth oxide.

In the first through third multi-layer piezoelectric elements of the present invention, it is preferable that diffusion junction is formed between the external electrode and the internal electrode at the ends thereof and the electrically conductive material of the internal electrode diffuses into the external electrode so as to form a neck. The diffusion junction between the electrically conductive material of the external electrode and the internal electrode makes the joint more firm. Thus it is made possible to prevent localized heat generation, spark or breakage from occurring in the joint between the internal electrode and the external electrode even when the device is operated at a high speed with a large electric current.

Also in the first through third multi-layer piezoelectric elements of the present invention, it is preferable that a glass-rich layer is formed on the surface of the external electrode on the side thereof facing the piezoelectric layer. Formation of the glass-rich layer on the surface of the external electrode on the side thereof facing the piezoelectric layer improves the strength of joining the external electrode and the stack.

Also in the first through third multi-layer piezoelectric elements of the present invention, it is preferable that thickness of the external electrode is smaller than that of the piezoelectric layer that constitutes the stack. When the external electrode is formed with a small thickness, hardness of the external electrode becomes lower and the load on the joint between the internal electrode and the external electrode can be decreased when the stack expands or contracts during operation, thus making it possible to suppress contact failure from occurring in the joint.

Also in the first through third multi-layer piezoelectric elements of the present invention, it is preferable that a groove is formed between the end of the other internal electrode and the external electrode on the first side face, with the groove being filled with an insulating material, while a groove is formed between the end of the one internal electrode and the external electrode on the second side face, with the groove being filled with an insulating material, and the insulating material has Young's modulus of value lower than that of the piezoelectric material.

This constitution enables it to ensure the insulation between the internal electrode and the external electrode, and enables the insulating material provided in the groove to deform in conformity with the expansion and contraction of the stack during operation, thereby preventing crack and other defects from occurring in the vicinity of the groove and reducing the occurrence of stress.

In the first through third multi-layer piezoelectric elements of the present invention, an electrically conductive assisting member formed from an electrically conductive adhesive, including a metal mesh or a mesh-like metal sheet embedded therein, may be provided on the external surface of the external electrode. With this constitution, since it is made possible to cause a large current to flow in the electrically conductive assisting member when the device is operated at a high speed with a large current, the external electrode can be prevented from breaking due to localized heat generation and durability can be greatly improved.

By embedding the metal mesh or mesh-like metal sheet in the electrically conductive assisting member, it is made possible to prevent cracks from occurring in the electrically conductive adhesive due to the expansion and contraction of the stack during operation.

Further in the multi-layer piezoelectric elements described above, it is preferable that the electrically conductive adhesive is polyimide resin having electrically conductive particles dispersed therein. When polyimide resin that has high heat resistance is used as the matrix component of the electrically conductive adhesive, high bonding strength of the electrically conductive adhesive can be maintained even used at a high temperature.

It is also preferable that the electrically conductive particles included in the electrically conductive adhesive are silver particles. When the electrically conductive particles are silver particles having low specific resistance, resistance of the electrically conductive adhesive can be made lower, so that localized heat generation can be prevented from occurring even when the stack is operated with a large current. Moreover, the electrically conductive particles are preferably non-spherical particles such as flakes or acicular particles, since it makes the electrically conductive particles entwined firmly with each other, thereby increasing the strength of the electrically conductive adhesive.

DESCRIPTION OF REFERENCE NUMERALS

Figure 1A:
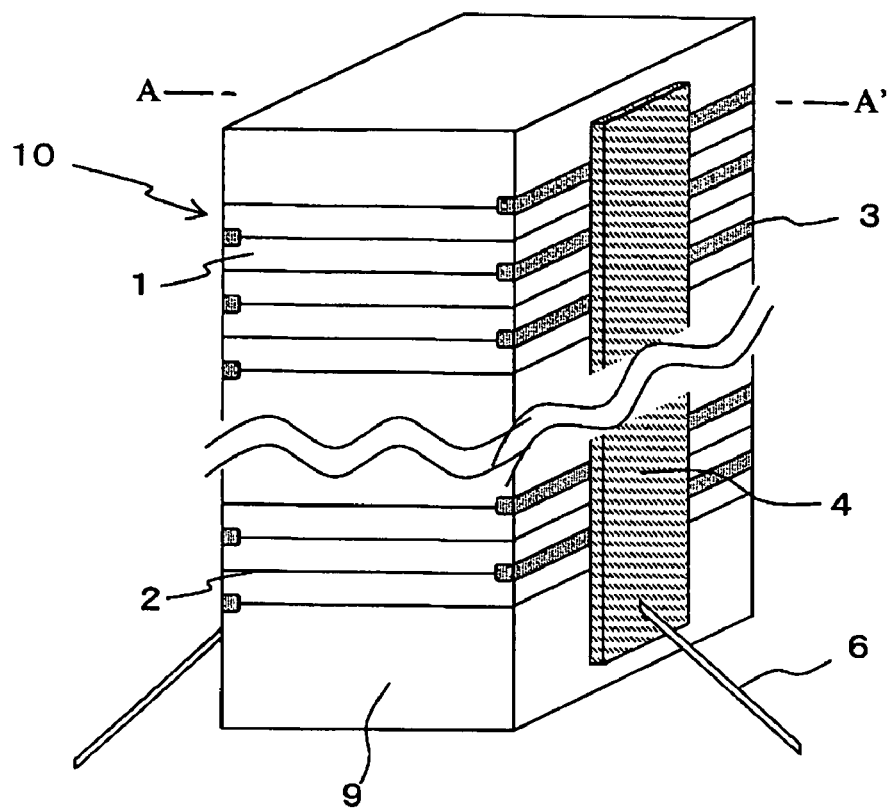
FIG. 1A is a perspective view of a multi-layer piezoelectric element according to first through third embodiments of the present invention.

1: Piezoelectric material
2: Internal electrode
3: Insulating material
4: External electrode
4b: Neck
6: Lead wire
10: Stack
31: Container
33: Injection hole
35: Valve
43: Piezoelectric actuator

MODE FOR CARRYING OUT THE INVENTION

First Embodiment

Figure 1B:
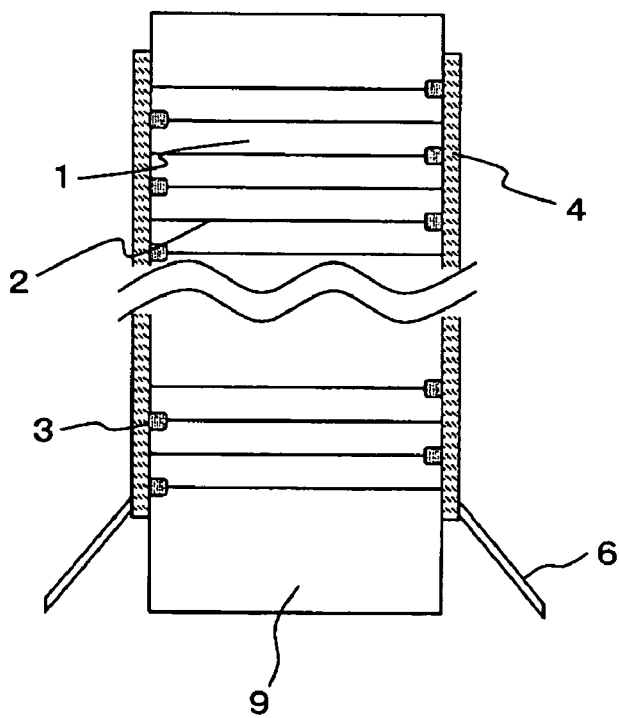
FIG. 1B is a longitudinal sectional view taken along lines A-A' of FIG. 1A.

FIG. 1A is a perspective view of a multi-layer piezoelectric element (multi-layer piezoelectric actuator) according to a first embodiment of the present invention, and FIG. 1B is a longitudinal sectional view taken along lines A-A' of FIG. 1A.

The multi-layer piezoelectric actuator of the first embodiment comprises a stack 10 having rectangular prism shape formed by stacking a plurality of piezoelectric layers 1 and a plurality of internal electrodes 2 alternately and external electrodes 4 formed on the side faces of the stack so as to be connected to the internal electrodes 2 in every other layer, as shown in FIG. 1A and FIG. 1B. Specifically, end of the internal electrode 2 is covered by an insulating material 3 in every other layer on the side face where the external electrode 4 is formed, so that the end face of the internal electrode 2 that is not covered by the insulating material 3 communicates with the external electrode 4. The external electrode 4 is formed from a porous electrically conductive material that has a three-dimensional mesh structure made of an electrically conductive material containing silver as the main component and glass, and a lead wire 6 is connected to the external electrode 4. Portion of the stack 10 identified by reference numeral 9 is an inactive layer wherein the internal electrode is not formed.

While the internal electrode 2 is disposed between the piezoelectric layers 1, the internal electrode 2 is formed from a metallic material such as silver-palladium and is used to apply a predetermined voltage to the piezoelectric layers 1, so that the piezoelectric element undergoes a displacement by the reverse piezoelectric effect according to the magnitude of voltage applied.

Formed on the side face of the stack 10 in every other layer are grooves measuring 30 to 500 µm in depth and 30 to 200 µm in width in the stacking direction. The grooves are filled with glass, epoxy resin, polyimide resin, polyamide-imide resin, silicone rubber or the like that has Young's modulus lower than that of the piezoelectric material 1 so as to form an insulating material 3. The insulating material 3 is preferably a material having a low value of elastic coefficient, particularly silicone rubber or the like, that can deform in conformity with the displacement of the stack 10, in order to make a firm joint with the stack 10

The external electrodes 4 are connected to the two opposing side faces of the stack 10, and the external electrodes 4 are electrically connected to the internal electrodes 2 that are stacked in every other layer. The external electrodes 4 serve to supply the voltage that is required in common to cause the piezoelectric layers 1 to undergo displacement by the reverse piezoelectric effect, to the internal electrodes 2 that are connected thereto.

Connected to the external electrode 4 is a lead wire 6 by soldering. The lead wire 6 serves to connect the external electrode 4 to an outside power supply.

Figure 2A:
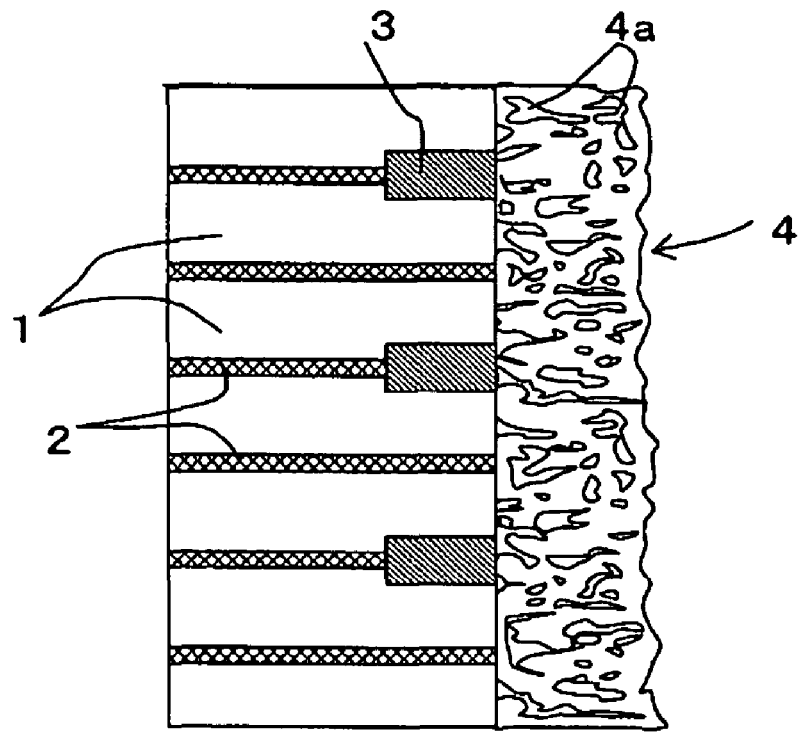
FIG. 2A is a sectional view showing enlarged part of FIG. 1B.
Figure 2B:
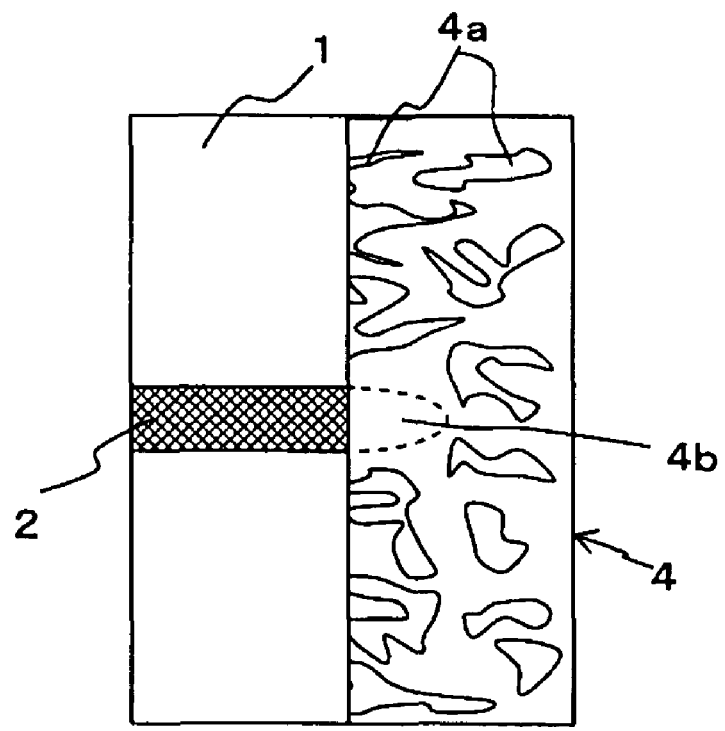
FIG. 2B is a sectional view showing enlarged part of FIG. 2A.

The first embodiment is characterized in that the external electrode 4 includes an electrically conductive material and glass, and is formed from a porous electrically conductive material having three-dimensional mesh structure as shown in FIG. 2. The three-dimensional mesh structure refers to such a condition of the material as an electrically conductive powder and a glass powder that constitute the external electrode 4 are fired at a relatively low temperature so that voids exist in such a state as sintering has not fully progressed with voids therein somewhat linked with each other because the electrically conductive powder that constitutes the external electrode 4 and the glass powder are fired at a relatively low temperature, and are bonded with each other in a three-dimensional configuration, rather than a state where spherical voids are included in the external electrode 4. FIG. 2A is a sectional view showing enlarged part of FIG. 1B, and FIG. 2B is a sectional view showing enlarged part of FIG. 2A.

The external electrodes 4 include 80 to 97% by volume of the electrically conductive material and 3 to 20% by volume of glass, with a trace of glass dispersed in the electrically conductive material. Content of glass is preferably in a range from 5 to 15% by volume. The external electrode 4 is joined partially with the side face of the stack 10, in such a state as the external electrode 4 is joined through diffusion bonding with the end of the internal electrode 2 that is exposed on the side face of the stack 10 and is joined partially with the side face of the piezoelectric material 1 of the stack 10. That is, a part of the mixture of the electrically conductive material and glass is bonded with the side face of the piezoelectric material 1 and voids 4a are formed between the side face of the piezoelectric material 1 and the external electrode 4. A large number of voids 4a are formed also in the external electrode 4, thereby forming the external electrode 4 from the porous electrically conductive material. The void 4a has such a complex shape as the powders of the electrically conductive material and glass retain the original shapes of the time before baking that remain substantially unaffected.

In the first embodiment, since the external electrodes 4 constituted from the electrically conductive material and glass and formed from the porous electrically conductive material that has a three-dimensional mesh structure are joined with the internal electrodes 2 through diffusion bonding and are partially joined with the stack 10, such problems can be prevented from occurring as spark between the external electrode 4 and the internal electrode 2, the external electrodes 4 coming off the stack 10 or breakage of the external electrode, even when operated continuously over a long period of time under a high electric field and a high pressure. According to the first embodiment, the external electrodes 4 can be formed in porous structure as a whole by baking the electrically conductive paste constituted from the electrically conductive material and glass that forms the external electrode 4 at a relatively low temperature, and can be bonded partially onto the side face of the stack 10.

The electrically conductive material that constitutes the external electrode 4 is preferably silver that has low Young's modulus or an alloy that includes silver as the main component, in order to fully absorb the stress generated by the expansion and contraction of the actuator.

In the first embodiment, a neck 4b is formed at the end of the internal electrode 2 that is connected to the external electrode 4 as shown in FIG. 2B, thus providing a firm connection between the internal electrode 2 and the external electrodes 4. The neck 4b is formed through diffusion bonding of the electrically conductive material included in the external electrode 4 and the material in the internal electrode 2

By forming the neck at the end of the internal electrode and embedding the neck in the external electrode, it is made possible to prevent localized heat generation from occurring in the joint between the internal electrode and the external electrode even when the device is operated at a high speed with a large electric current.

According to the first embodiment, the external electrode 4 preferably includes 30 to 70% by volume of voids 4a, so that the external electrode 4 can accommodate the stress caused by the expansion and contraction of the actuator. When the void ratio in the external electrode 4 is less than 30% by volume, the external electrode 4 may not be able to endure the stress caused by the expansion and contraction of the actuator, and eventually break. When the void ratio in the external electrode 4 is higher than 70% by volume, on the other hand, resistance of the external electrode 4 becomes higher and the external electrode undergoes localized heating that leads to breakage if a large current flows.

In the first embodiment, the softening point of the glass component that constitutes the external electrodes 4 is not higher than the melting point of the electrically conductive material that constitutes the external electrode 4. This is for the purpose of making it possible to set the baking temperature of the external electrodes 4 at a temperature not higher than the melting point the electrically conductive material and not lower than the softening point of the glass. This enables it to form the porous material, prevent coagulation of the electrically conductive material from occurring and form the external electrode with sufficient bonding strength by baking.

Also in the first embodiment, the glass that constitutes the external electrode 4 is amorphous. This makes the external electrodes 4 capable of absorbing the stress caused by the expansion and contraction of the actuator, thus preventing cracks or other defects from occurring in the external electrode.

Also according to the first embodiment, it is preferable that thickness of the external electrode 4 is smaller than that of the piezoelectric layer 1 that constitutes the stack 10. With this constitution, the external electrode 4 has a proper level of strength in the stacking direction of the stack 10, so that the load on the joint between the internal electrode 2 and the external electrode 4 can be decreased when the actuator expands or contracts during operation, thus making it possible to suppress contact failure from occurring in the joint.

The method for manufacturing the multi-layer piezoelectric element according to the present invention will be described below. First, a calcined powder of a piezoelectric ceramic material such as PZT, a binder made of an organic polymer such as acrylic resin or butyral resin and a plasticizer such as DOP (dioctyl phthalate) or DBP (dibutyl phthalate) are mixed to form a slurry which is formed into a ceramic green sheet that would become the piezoelectric material 1 by a known method such as doctor blade process or tape molding method such as calender roll process.

Then silver-palladium powder, a binder and a plasticizer are mixed to prepare an electrically conductive paste which is applied onto the top surface of the ceramic green sheet, that has been made as described above, by screen printing or the like to a thickness of 1 to 40 μm.

A plurality of the green sheets having the electrically conductive paste printed thereon are stacked one on another, with the stack being heated at a predetermined temperature to remove the binder and fired at a temperature in a range from 900 to 1200° C. thereby to make the stack 10

The method of making the stack 10 is not limited to that described above, and any manufacturing method may be employed as long as the stack 10 can be made in such a constitution as a plurality of the piezoelectric layers and a plurality of the internal electrodes are stacked alternately one on another.

Figure 3A:
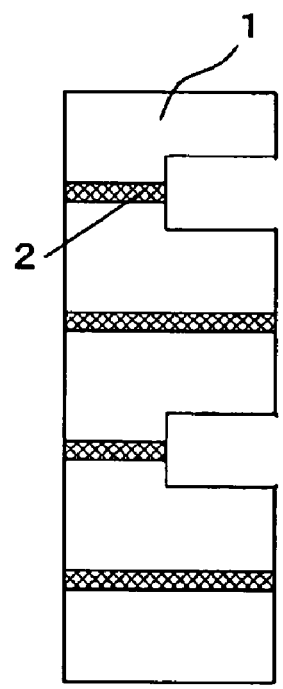
FIG. 3A is a sectional view showing a stage after forming a groove in a side face in a method for manufacturing the multi-layer piezoelectric element of the present invention.

Then a groove is formed in every other layer on the side face of the stack 10 by a dicing apparatus or the like, as shown in FIG. 3A.

Figure 3B:
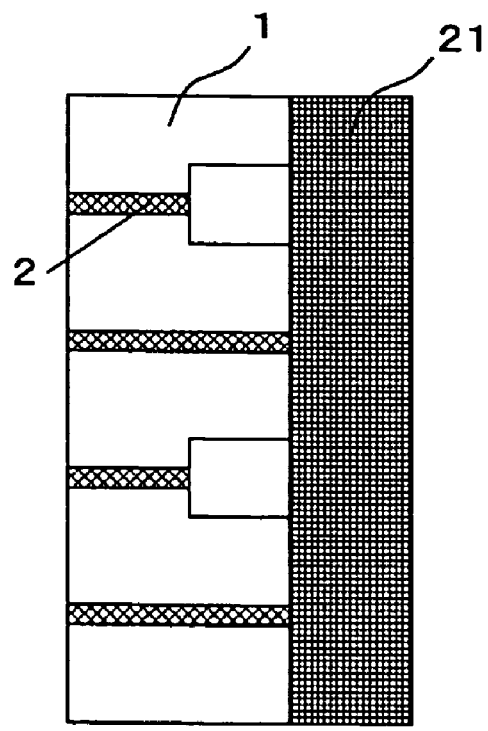
FIG. 3B is a sectional view showing a stage after forming an electrically conductive paste 21 on a side face in the method for manufacturing the multi-layer piezoelectric element of the present invention.
Figure 3C:
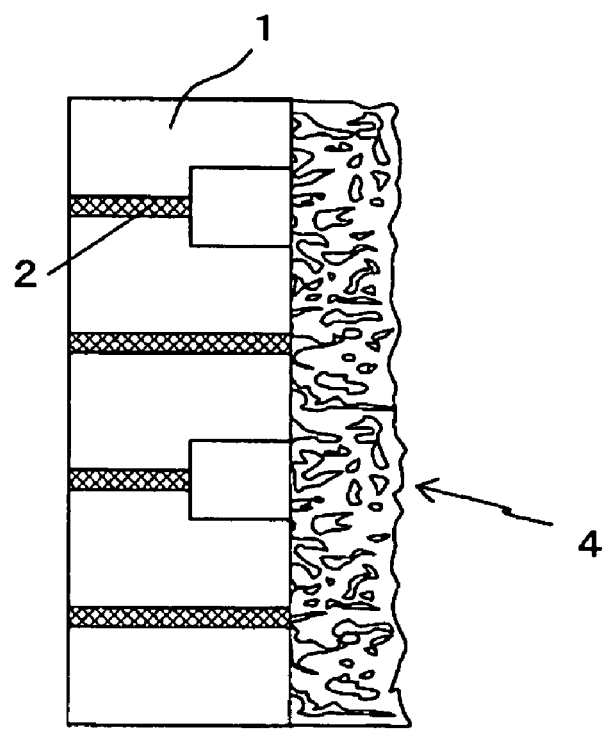
FIG. 3C is a sectional view showing a stage after forming the external electrode 4 on a side face in the method for manufacturing the multi-layer piezoelectric element of the present invention.

A binder is added to a mixture of 80 to 97% by volume of silver powder having particle size of 0.1 to 10 μm and 3 to 20% by volume of glass powder having softening point of 450 to 800° C. comprising silicon having particle size of 0.1 to 10 μm as the main component, so as to prepare an electrically conductive silver-glass paste. The electrically conductive silver-glass paste is formed into a sheet and is dried to remove solvent while controlling the density of the green sheet 21 in a range from 6 to 9 g/cm³. The sheet 21 is transferred onto the external electrode forming surface of the stack 10 having the grooves formed therein as shown in FIG. 3B, and is bonded by baking at a temperature that is higher than the softening point of the glass, not higher than the melting point (965° C.) of silver and is not higher than ⅘ times the firing temperature (° C.). This causes the binder component in the sheet 21 formed from the electrically conductive silver-glass paste to evaporate and forms the external electrode 4 from the porous electrically conductive material having three-dimensional mesh structure as shown in FIG. 3C.

By setting the baking temperature (° C.) of the external electrodes at a temperature not higher than ⅘ times the firing temperature (° C.) of the stack, it is made possible to cause a proper amount of the glass component that constitutes the external electrodes to diffuse into the stack so as to prevent the bonding strength from decreasing between the stack and the external electrode.

In order to form the external electrode 4 having three-dimensional mesh structure, it is important to control the density of the green sheet 21 in a range from 6 to 9 g/cm³. Density of the green sheet 21 can be measured by Archimedes method. In order to achieve void ratio of the external electrode 4 in a range from 30 to 70%, density of the green sheet 21 is preferably controlled in a range from 6.2 to 7.0 g/cm³.

When the electrically conductive silver-glass paste is bonded by baking, the voids 4a are formed in the external electrode 4, and the neck 4b is formed through diffusion bonding of silver included in the electrically conductive silver-glass paste and the silver-palladium alloy included in the internal electrode 2, while the external electrodes 4 are partially bonded onto the side face of the stack. In the neck 4b, Pd diffuses from the internal electrode 2 and forms silver-palladium alloy.

The temperature at which the electrically conductive silver-glass paste is bonded by baking is preferably in a range from 550 to 700° C. This temperature range enables it to form the effective neck 4b, make diffusion bonding of silver included in the electrically conductive silver-glass paste and the internal electrode 2, cause the voids in the external electrode 4 to effectively remain and results in partial bonding of the external electrode 4 and the side face of the column-like stack 10. Softening point of the glass component included in the electrically conductive silver-glass paste is preferably in a range from 500 to 700° C.

When the baking temperature is higher than 700° C., sintering of the silver powder of the electrically conductive silver-glass paste would proceed excessively, such that the porous electrical conductor of three-dimensional mesh structure cannot be effectively formed. That is, the external electrode 4 becomes too dense, resulting in Young's modulus of the external electrode 4 that is too high to effectively absorb the stress generated during operation, eventually leading to breakage of the external electrode 4. Bonding by baking is preferably carried out at a temperature that is not higher than 1.2 times the softening point of the glass.

When the baking temperature is lower than 550° C., on the other hand, the end of the internal electrode 2 and the external electrode 4 cannot be joined sufficiently through diffusion bonding, and therefore the neck 4b cannot be formed thus resulting in spark occurring between the internal electrode 2 and the external electrode 4 during operation.

Thickness of the sheet 21 formed from the electrically conductive silver-glass paste is preferably smaller than the thickness of the piezoelectric layer 1. More preferably, the thickness is 50 μm or less in order to accommodate the contraction and expansion of the actuator.

The reason for setting the composition of the electrically conductive silver-glass paste 21 in the range from 80 to 97% by volume of silver powder and 3 to 20% by volume of glass powder is as follows. When the content of the silver powder is less than 80% by volume, relatively high content of glass makes it impossible to effectively form the voids 4a in the external electrode 4 when it is baked and makes it impossible to partially bond the external electrode 4 to the side face of the stack 10. When the content of the silver powder is higher than 97% by volume, relatively low content of glass results in weaker bonding between the external electrode 4 and the stack 10, thus giving rise to the possibility of the external electrode 4 coming off the stack 10 during operation of the multi-layer piezoelectric actuator.

For the glass component that constitutes the external electrode 4, silica glass, soda-lime glass, lead alkali silicate glass, aluminoborosilicate glass, borosilicate glass, aluminosilicate glass, borate glass, phosphate glass or the like may be used.

The borosilicate glass, for example, may include 40 to 70% by weight of $SiO_2$, 2 to 30% by weight of $B_2O_3$, 0 to 20% by weight of $Al_2O_3$, 0 to 10% by weight in total of oxides of alkali earth metals such as MgO, CaO, SrO and BaO, and 0 to 10% by weight of alkali metal oxide. The borosilicate glass may be such that includes 5 to 30% by weight of ZnO. ZnO has an effect of lowering the processing temperature of borosilicate glass.

Phosphate glass may include 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may include 0 to 80% by weight of $PbO_3$, 0 to 40% by weight of $SiO_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

The stack 10 having the external electrodes 4 formed thereon is immersed in silicone rubber solution, and the silicone rubber solution is subjected to vacuum deaeration so as to fill the grooves of the stack 10 with the silicone rubber. Then the stack 10 is pulled out of the silicone rubber solution and is coated with the silicone rubber on the side faces thereof. Then the silicon rubber that fills the groove and covers the side faces of the stack 10 is cured.

Then lead wires 6 are connected to the external electrodes 4 thereby completing the multi-layer piezoelectric element of the present invention.

Through the lead wires 6, DC voltage of 0.1 to 3 kV/mm is applied between the pair of external electrodes 4 so as to apply polarization treatment to the stack 10, thereby to complete the multi-layer piezoelectric actuator. When the lead wires 6 of the multi-layer piezoelectric actuator are connected to an external voltage source and the voltage is supplied via the lead wires 6 and the external electrodes 4 to the internal electrodes 2, the piezoelectric layers 1 undergo a significant amount of displacement by the reverse piezoelectric effect, so as to drive, for example, an automobile fuel injection valve that supplies fuel to an engine.

In the multi-layer piezoelectric element having the constitution described above, since the external electrodes 4 that include the electrically conductive material consisting mainly of silver and glass and is constituted from the porous electrical conductor of three-dimensional mesh structure is partially bonded to the side face of the stack 10, the external electrodes 4 can satisfactorily absorb the stress generated during operation even when the actuator is operated continuously over a long period of time under high electric field. As a result, an actuator having high reliability can be provided where such problems as spark between the external electrode 4 and the internal electrode 2 or breakage of the external electrode 4 can be prevented from occurring.

According to the first embodiment, it is preferable that the metal component of the internal electrode 2 includes Ag as the main component and 15% by weight or less of at least one kind of the Pd and Pt group metals. When the internal electrode 2 includes 15% by weight or less of at least one kind of the Pd and Pt group metals, difference in composition between the internal electrodes 2 and the external electrodes 4 can be made smaller so as to achieve better cross diffusion of metals between the internal electrodes 2 and the external electrodes 4, thus resulting in higher reliability of the joint between the internal electrodes 2 and the external electrodes 4 and higher durability. Bonding strength of the internal electrodes 2 in the stack 10 can be improved by including the powder of substantially the same composition as that of the stack 10 in the internal electrodes 2

The multi-layer piezoelectric element of the present invention is not limited to the constitutions described above, and various modifications may be made without deviating from the spirit of the present invention.

While an example where the external electrodes 4 are formed on the opposing side faces of the stack 10 has been described above, a pair of external electrodes may be formed, for example, on adjacent side faces according to the present invention.

Second Embodiment

The multi-layer piezoelectric element (multi-layer piezoelectric actuator) according to the second embodiment of the present invention is the multi-layer piezoelectric element of the first embodiment modified to constitute the internal electrode 2 and the external electrode 4 as described below.

In the multi-layer piezoelectric actuator of the second embodiment, the external electrode 4 is formed from an electrically conductive material containing silver as the main component and glass, and the internal electrode 2 contains an electrically conductive material and a piezoelectric material.

The proportion X (% by weight) of silver in the electrically conductive material of the internal electrode 2, the proportion Z (% by weight) of silver in the internal electrode 2 containing the electrically conductive material and the piezoelectric material and the proportion Y (% by weight) of silver in the external electrode 4 satisfy conditions of $X \geq 85$ and $0.9 \leq X/Y \leq 1.1$. This is because value of X less than 85% means higher weight proportion of palladium in the internal electrode 2 that makes it impossible to manufacture the multi-layer piezoelectric actuator at a low cost. When the ratio X/Y is less than 0.9, the content of silver contained in the internal electrode 2 is less than the content of silver contained in the external electrode 4, resulting in less cross diffusion of silver contained in the internal electrode 2 and in the external electrode 4 when the external electrode 4 is bonded by baking. This weakens the bonding strength between the internal electrode 2 and the external electrode 4 leading to lower durability of the multi-layer piezoelectric actuator. When the ratio X/Y is higher than 1.1, the content of silver contained in the external electrode 4 is less than the content of silver contained in the internal electrode 2, resulting in less cross diffusion of silver contained in the internal electrode 2 and in the external electrode 4 when the external electrode 4 is bonded by baking. This weakens the bonding strength between the internal electrode 2 and the external electrode 4 leading to lower durability of the multi-layer piezoelectric actuator.

When the proportion X (% by weight) of silver in the electrically conductive material of the internal electrode 2 and the proportion Y (% by weight) of silver in the external electrode 4 formed from an electrically conductive material containing silver as the main component and glass satisfy conditions of $X \geq 85$ and $0.9 \leq X/Y \leq 1.1$, in contrast, the use of expensive palladium in the internal electrode 2 can be reduced, and therefore the multi-layer piezoelectric actuator can be manufactured at a low cost. Also because the proportion X (% by weight) of silver in the internal electrode 2 is substantially equal to the proportion Y (% by weight) of silver in the external electrode 4, cross diffusion of silver contained in the internal electrode and in the external electrode is accelerated when the external electrode 4 is bonded by baking. This results in strong bonding between the internal electrode 2 and the external electrode 4. As a result, excellent durability is achieved such that the internal electrode 2 and the external electrode 4 do not break even when operated continuously over a long period of time under high electric field and high pressure.

It is more preferable that the internal electrode 2 consists of an electrically conductive material and a piezoelectric material and the proportion Z (% by weight) of silver in the internal electrode 2 satisfies condition of $0.7 \leqq Z/Y \leqq 1.0$, for the reason described below. When the ratio Z/Y is less than 0.7, the content of silver contained in the internal electrode 2 is less than the content of silver contained in the external electrode 4, resulting in higher resistance of the internal electrode 2 than that of the external electrode 4 and causing localized heat generation in the internal electrode 2. When the ratio Z/Y is higher than 1.0, the content of the piezoelectric material in the internal electrode 2 becomes smaller, resulting in weaker bonding between the internal electrode 2 and the piezoelectric material 1, eventually leading to peel-off between the internal electrode 2 and the piezoelectric material 1 in the interface thereof. Also because the content of silver contained in the external electrode 4 is less than the content of silver contained in the internal electrode 2, less cross diffusion of silver contained in the internal electrode and in the external electrode occurs thus resulting in weaker bonding strength between the internal electrode 2 and the external electrode 4

Figure 2C:
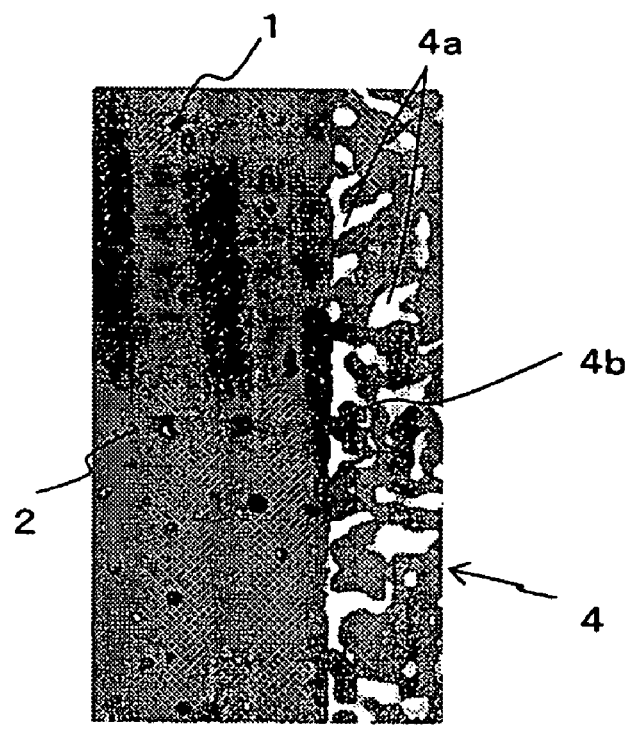
FIG. 2C is a photograph of the same section as shown in FIG. 2B.

In the second embodiment, as described in the first embodiment by making reference to FIGS. 2B and 2C, it is preferable that the external electrode 4 is joined through diffusion bonding with the end of the internal electrode 2 that is exposed on the side face of the stack 10, and the neck 4b is formed through diffusion of the electrically conductive material included in the internal electrode 2 into the external electrode 4. When the neck 4b is not formed, localized heat generation, spark or other defects may occur in the joint between the internal electrode 2 and the external electrode 4 when the multi-layer piezoelectric element is operated at a high speed with a large electric current.

It is also preferable that the external electrodes 4 are constituted from the porous electrical conductor of three-dimensional mesh structure. Unless the external electrodes 4 are constituted from the porous electrical conductor of three-dimensional mesh structure, the external electrode 4 cannot be flexible enough to follow the expansion and contraction of the multi-layer piezoelectric element, thus resulting in breakage of the external electrodes 4 and/or contact failure between the external electrodes 4 and the internal electrodes 2

Further as described in the first embodiment, it is preferable that the external electrodes 4 include 30 to 70% by volume of voids also in the second embodiment.

It is also preferable that a glass-rich layer is formed on the surface of the external electrode 4 on the side facing the piezoelectric material 1. Without the glass-rich layer, it becomes difficult to bond with the glass component of the external electrode 4, thus making it difficult to form a strong bonding between the external electrode 4 and the piezoelectric material 1

It is also preferable that the softening point (° C.) of the glass contained in the external electrode 4 is not higher than ⅘ of the melting point (° C.) of the electrically conductive material that constitutes the internal electrode 2 or lower. When the softening point of the glass is higher than ⅘ of the melting point of the electrically conductive material that constitutes the internal electrode 2, since softening point of the glass that constitutes the external electrode 4 becomes approximate to the melting point of the electrically conductive material that constitutes the internal electrode 2, baking temperature of the external electrode 4 becomes nearer to the melting point of the electrically conductive material that constitutes the internal electrode 2. This leads to coagulation of the electrically conductive materials of the internal electrode and the external electrode, thus making an obstacle to the diffusion bonding, and makes it difficult to set the baking temperature to a proper level for the glass component of the external electrode 4 to soften, thus making it unable to achieve sufficient strength of bonding with the glass.

It is also preferable that the glass that constitutes the external electrode 4 is amorphous. When the glass is crystalline, the external electrode 4 cannot accommodate the stress caused by the expansion and contraction of the multi-layer piezoelectric actuator, thus resulting in cracks or other defects.

It is also preferable that thickness of the external electrode 4 is smaller than that of the piezoelectric layer 1. When the external electrode 4 is formed to be thicker than the piezoelectric layer 1, the external electrode 4 becomes stronger and gives rise to a possibility that load on the joint between the internal electrode and the external electrode 4 increases when the stack 10 expands or contracts during operation, eventually resulting in contact failure in the joint.

It is also preferable that the groove formed in the side face of the stack 10 is filled with an insulating material 3 that has Young's modulus lower than that of the piezoelectric material 1, while the internal electrode and the external electrode are insulated in every other layer as shown in FIG. 2 and FIG. 3. While the piezoelectric material 1 interposed between the internal electrodes 2 expands and contracts according to a voltage applied between the adjacent internal electrodes 2, the piezoelectric material 1 located near the side face of the stack 10 that is not interposed between the internal electrodes 2 does not expand nor contract even when a voltage is applied across the internal electrodes 2. As a result, compressive stress or tensile stress is generated every time a voltage is applied across the internal electrodes 2. When the groove is formed in the side face of the stack 10 and is filled with the insulating material 3 that has Young's modulus lower than that of the piezoelectric material 1, on the other hand, stress generated in the side face of the stack 10 when the stack 10 expands or contracts can be mitigated by the expansion or contraction of the insulating material 3, thereby improving the durability.

When the insulating material 3 that fills the groove has Young's modulus higher than that of the piezoelectric material 1, stress generated near the side face of the stack 10 cannot be mitigated by the expansion or contraction of the insulating material 3, and therefore durability of the multi-layer piezoelectric element may become lower.

While the internal electrode 2 is preferably formed from a silver-palladium alloy having low palladium content for the reason of cost, for that purpose it is preferable to use the piezoelectric material 1 that can be fired at a temperature of about 980° C. or lower. The material that constitutes the piezoelectric layer 1 preferably contains $PbZrO_3$—$PbTiO_3$ as the main component and 10 to 20 mol % of $Pb(Yb_{1/2}Nb_{1/2})$ $O_3$, $Pb(Co_{1/3}Nb_{2/3})O_3$ and $Pb(Zn_{1/3}Nb_{2/3})O_3$ as an auxiliary component. In case a silver-palladium alloy having palladium content of 5% by weight in the phase diagram of the silver-palladium alloy is used, a piezoelectric material that contains $PbZrO_3$—$PbTiO_3$ as the main component and 10 to 20 mol % of $Pb(Yb_{1/2}Nb_{1/2})O_3$, $Pb(Co_{1/3}Nb_{2/3})O_3$ and $Pb(Zn_{1/3}Nb_{2/3})O_3$ added thereto as an auxiliary component may be used as the piezoelectric layer 1 that can be fired at a temperature of about 980° C. or lower.

In case a silver-palladium alloy having palladium content of 5% by weight is used to form the internal electrode 2, melting point of the electrically conductive material (silver-palladium alloy) that constitutes the internal electrode 2 is exceeded when the internal electrode 2 is fired at 1100° C. This leads to coagulation of the electrically conductive material of the internal electrode 2, and may eventually results in delamination. In order to use a silver-palladium alloy having low palladium content as the electrically conductive material of the internal electrode 2, it is necessary to keep the firing temperature of the piezoelectric layer 1 to about 980° C. or lower.

The external electrode 4 is constituted from 87 to 99.5% by weight of electrically conductive material and 0.5 to 13% by weight of glass powder, with the small amount of glass dispersed in the electrically conductive material. The external electrode 4 is partially bonded with the side face of the stack 10. That is, the external electrode 4 is bonded to the end of the internal electrode 2 that is exposed on the side face of the stack 10 through diffusion of the electrically conductive material in the external electrode 4, and is bonded to the side face of the stack 10 mainly via the glass component contained in the external electrode 4. That is, a part of the mixture of the electrically conductive material and glass is bonded with the side face of the piezoelectric material 1 and voids 4a are formed between the side face of the piezoelectric material 1 and the external electrode 4. A large number of voids 4a are formed also in the external electrode 4, thereby forming the external electrode 4 from the porous electrically conductive material. The void 4a has such a complex shape as the powders of the electrically conductive material and glass retain the original shapes at a time before baking, that remain substantially unaffected.

The electrically conductive material of the external electrode 4 is preferably formed from silver that has low Young's modulus or an alloy containing silver as the main component in order to effectively absorb the stress generated by the expansion and contraction of the multi-layer piezoelectric actuator, and the external electrode 4 as a whole is preferably formed from a porous electrically conductive material having flexible three-dimensional mesh structure.

The multi-layer piezoelectric actuator of the second embodiment can be manufactured similarly to the multi-layer piezoelectric actuator of the first embodiment.

First, the stack 10 is made similarly to the first embodiment.

The silver-palladium alloy used to form the internal electrode 2 is preferably one that contains low palladium content, particularly one that contains 10% by weight or less palladium for the reason of cost. For that purpose it is preferable to use the piezoelectric material 1 that can be fired at a temperature of about 980° C. or lower, and piezoelectric layer 1 that contains $PbZrO_3$—$PbTiO_3$ as the main component and 10 to 20 mol % of $Pb(Yb_{1/2}Nb_{1/2})O_3$, $Pb(Co_{1/3}Nb_{2/3})O_3$ and $Pb(Zn_{1/3}Nb_{2/3})O_3$ added as an auxiliary component may be used. Silver-palladium composition that constitutes the internal electrode may be either a powder of silver-palladium alloy or a mixture of silver powder and palladium powder. When a mixture of silver powder and palladium powder is used, too, silver-palladium alloy can be formed as well by firing.

Proportion of the piezoelectric material (calcined powder of piezoelectric ceramics) to be added to the electrically conductive paste when forming the internal electrode 2 is preferably such that the internal electrode 2 after firing contains 75 to 93% by weight of the electrically conductive material and 7 to 25% by weight of the piezoelectric material, in order to increase the bonding strength of the internal electrode and the piezoelectric layer 1 and keep the resistance of the internal electrode 2 sufficiently low.

Method for manufacturing the stack 10 is not limited to that described above, and any method may be employed as long as the stack 10 can be formed in such a constitution as a plurality of piezoelectric layers 1 and a plurality of internal electrodes 2 are stacked alternately one on another.

After forming the stack 10, grooves are formed on the side face of the stack 10 in every other layer by a dicing apparatus or the like, as shown in FIG. 3A.

A binder is added to a mixture of 87 to 99.5% by weight of silver powder having particle size of 0.1 to 10 μm and 0.5 to 13% by weight of glass powder having softening point of 450 to 800° C. comprising silicon having particle size of 0.1 to 10 μm as the main component, so as to prepare electrically conductive silver-glass paste that is formed into a sheet and is dried to remove solvent while controlling the density of the green sheet 21 in a range from 6 to 9 g/cm³. The sheet 21 is transferred onto the external electrode forming surface of the stack 10 having the grooves formed therein as shown in FIG. 3B, and is bonded by baking at a temperature that is higher than the softening point of the glass and is not higher than the melting point of silver, thereby to form the external electrode 4.

The external electrode 4 formed from the porous electrically conductive material having three-dimensional mesh structure may also be made as the binder component is removed from the sheet 21 that is formed from the electrically conductive silver-glass paste as shown in FIG. 3C. In order to form the external electrode 4 having three-dimensional mesh structure, in particular, density of the green sheet 21 is preferably controlled in a range from 6 to 9 g/cm³. In order to achieve void ratio in the external electrode 4 in a range from 30 to 70%, density of the green sheet 21 is preferably controlled in a range from 6.2 to 7.0 g/cm³. Density of the green sheet 21 can be measured by Archimedes method.

As the silver-glass paste is baked, the voids 4a are formed in the external electrode 4 while silver contained in the silver-glass paste may be combined through diffusion with the silver-palladium alloy contained in the internal electrode 2 so as to form the neck 4b, with the external electrode 4 being partially bonded onto the side face of the stack 10. In the neck 4b, because of cross diffusion of the silver-palladium alloy contained in the internal electrode 2 and silver contained in the external electrode 4, palladium that has diffused from the internal electrode 2 can be detected by a common analytical method (for example, EPMA, EDS, etc.).

Baking temperature of the electrically conductive silver-glass paste is preferably set in the range described in the first embodiment, in order to effectively form the neck 4b.

Thickness of the sheet 21 of the silver-glass paste is preferably smaller than that of the piezoelectric layer 1, and is more preferably 50 μm or less so as to deform in conformity with the expansion and contraction of the multi-layer piezoelectric actuator.

The reason for setting the composition of the electrically conductive silver-glass paste 21 in the range from 87 to 99.5% by weight of silver powder and 0.5 to 13% by weight of glass powder is as follows. When the content of the silver powder is less than 87% by weight, relatively high content of glass makes it impossible to effectively form the voids 4a in the external electrode 4 when it is baked and partially bond the external electrode 4 to the side face of the stack 10. When the content of the silver powder is higher than 97% by volume and 99.5% by weight, relatively low content of glass results in weaker bonding between the external electrode 4 and the stack 10, thus giving rise to the possibility of the external electrode 4 coming off the stack 10 during operation of the multi-layer piezoelectric actuator.

For the glass component contained in the external electrode 4, silica glass, soda-lime glass, lead alkali silicate glass, aluminoborosilicate glass, borosilicate glass, aluminosilicate glass, borate glass, phosphate glass, lead glass or the like may be used.

The borosilicate glass, for example, may contain 40 to 70% by weight of $SiO_2$, 2 to 30% by weight of $B_2O_3$, 0 to 20% by weight of $Al_2O_3$, 0 to 10% by weight in total of oxides of alkali earth metals such as MgO, CaO, SrO and BaO, and 0 to 10% by weight of alkali metal oxide. The borosilicate glass may contain 5 to 30% by weight of ZnO. ZnO has an effect of lowering the processing temperature of borosilicate glass.

Phosphate glass may contain 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may contain 0 to 80% by weight of $PbO_3$, 0 to 40% by weight of $SiO_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

The multi-layer piezoelectric actuator of the second embodiment can be manufactured similarly to the first embodiment.

The stack 10 having the external electrodes 4 formed thereon is immersed in silicone rubber solution and is subjected to vacuum deaeration so as to fill the grooves of the stack 10 with the silicone rubber, and then the silicone rubber is cured.

Lead wires 6 are connected to the external electrodes 4, and DC voltage of 0.1 to 3 kV/mm is applied between the pair of external electrodes 4 via the lead wires 6 so as to apply polarization treatment to the stack 10, thereby to complete the multi-layer piezoelectric actuator that functions as a fuel injection valve for supplying fuel to an automobile engine.

Third Embodiment

The multi-layer piezoelectric element (multi-layer piezoelectric actuator) according to the third embodiment of the present invention is the device shown in FIGS. 1A and 1B where the internal electrode 2 is made of an electrically conductive material containing silver as the main component and at least one of palladium and platinum, the external electrode 4 is made of an electrically conductive material containing silver as the main component and glass, and proportion of silver in the electrically conductive material that constitutes the internal electrode 2 located near the joint with the external electrode 4 is set higher than the proportion of silver in the electrically conductive material that constitutes the internal electrode 2 located inside of the stack 10.

By setting the proportion of silver in the electrically conductive material that constitutes the internal electrode 2 located near the joint with the external electrode 4 higher than the proportion of silver in the electrically conductive material that constitutes the internal electrode 2 located inside of the stack 10, it becomes possible to make the concentration of silver contained as the main component of the electrically conductive material of the external electrode 4 and concentration of silver in electrically conductive material of the internal electrode approximate to each other, thus making the bonding between the internal electrode 2 and the external electrode 4 more secure through cross diffusion of silver.

That is, since the concentration of silver contained as the main component in the electrically conductive material of the external electrode 4 and the concentration of silver in electrically conductive material of the internal electrode 5 become substantially equal to each other, cross diffusion of silver in the external electrode 4 and silver in the internal electrode is accelerated when the external electrode 4 is bonded by baking onto the stack 10. This enables it to firmly join the internal electrode 2 and the external electrode 4, so that excellent durability is achieved such that internal electrode 2 and the external electrode 4 do not break even when operated continuously over a long period of time under high electric field and high pressure.

It is also preferable that the proportion of silver contained in the electrically conductive material of the internal electrode 2 becomes higher toward the external electrode 4. Since this arrangement results in a gradient of silver concentration that varies continuously toward the external electrode, stable internal electrode 2 and junction of internal electrode 2 and the external electrode 4 can be achieved.

It is also preferable that the internal electrode 2 and the external electrode 4 are bonded together by diffusion through the neck 4b. This enables it to prevent spark or breakage from occurring in the joint between the internal electrode 2 and the external electrode 4 even when the actuator is operated at a high speed with a large current, since the neck 4b that endures large current is formed in the junction between the internal electrode 2 and the external electrode 4. Also because the internal electrode 2 and the external electrode 4 are bonded together by diffusion through the neck 4b, there is no distinct border in the composition in the junction between the internal electrode 2 and the external electrode 4, so that the junction having high reliability can be formed. The neck 4b refers to the portion formed through cross diffusion of the electrically conductive material of the internal electrode 2 and the electrically conductive material of the external electrode 4.

By setting the silver content contained in the electrically conductive material of the internal electrode 2 to 85% or higher, it is made possible to form a reliable Junction with the external electrode 4 through diffusion of silver by making use of high concentration of silver in the internal electrode 2. Also because the use of expensive materials such as palladium and platinum can be reduced by setting the silver content contained in the electrically conductive material of the internal electrode to 85% or higher, the multi-layer piezoelectric element can be manufactured at a lower cost. When the silver content in the electrically conductive material of the internal electrode 2 is lower than 85%, the use of expensive materials such as palladium and platinum inevitably increases and it becomes impossible to manufacture the multi-layer piezoelectric element at a lower cost. Also the low silver content in the electrically conductive material of the internal electrode 2 makes the junction with the external electrode 4 insecure. The proportion of silver contained in the electrically conductive material of the internal electrode 2 refers to the proportion of silver within the stack 10 at a position located 1 mm or more away from the junction with the external electrode 4 where the proportion of silver contained in the electrically conductive material of the internal electrode 2 does not vary.

It is also preferable that a glass-rich layer is formed on the surface of the external electrode 4 on the side thereof facing the piezoelectric layer 1. Having much glass component of the external electrode 4 located in the interface of bonding with the piezoelectric layer 1 improves the strength of joining of the external electrode 4 and the side face of the stack 10.

Moreover, it is preferable that the glass component of the external electrode 4 exists in a region substantially not more than 80% in thickness of the external electrode 4 on the side of the surface of the stack 10. This results in such a constitution of the external electrode 4 that the glass component that supports the junction with the stack 10 exists near the surface on the side of the piezoelectric layer 1 and therefore achieves strong bonding between the external electrode 4 and the stack 10, while only the electrically conductive material that contains silver as the main component exists on the surface of the external electrode 4 exposed to the atmosphere, so that the external electrode 4 having a surface that is satisfactorily wetted by solder is provided when a lead wire is soldered onto the external electrode 4.

It is also preferable that the glass component of the external electrode 4 contains lead oxide or bismuth oxide. The external electrode 4 can be joined more firmly with the piezoelectric material when the glass component of the external electrode 4 contains lead oxide or bismuth oxide that can form strong junction with the piezoelectric layer 1. When the glass component of the external electrode 4 does not contain lead oxide or bismuth oxide, such a problem may occur as the external electrode 4 comes off the side face of the stack 10 during operation.

While the internal electrode 2 is preferably formed from a silver-palladium alloy having low palladium content for the reason of cost, for that purpose it is preferable to use the piezoelectric material 1 that can be fired at a temperature of about 980° C. or lower. The material that constitutes the piezoelectric layer 1 preferably contains $PbZrO_3$—$PbTiO_3$ as the main component and 10 to 20 mol % of $Pb(Yb_{1/2}Nb_{1/2})O_3$, $Pb(Co_{1/3}Nb_{2/3})O_3$ and $Pb(Zn_{1/3}Nb_{2/3})O_3$ as an auxiliary component. In case a silver-palladium alloy having palladium content of 5% by weight in the phase diagram of the silver-palladium alloy is used, a piezoelectric material that contains $PbZrO_3$—$PbTiO_3$ as the main component with 10 to 20 mol % of $Pb(Yb_{1/2}Nb_{1/2})O_3$, $Pb(Co_{1/3}Nb_{2/3})O_3$ and $Pb(Zn_{1/3}Nb_{2/3})O_3$ added thereto as an auxiliary component may be used as the piezoelectric layer 1 that can be fired at a temperature of about 980° C. or lower.

In case a silver-palladium alloy having palladium content of 5% by weight is used to form the internal electrode 2, melting point of the electrically conductive material (silver-palladium alloy) that constitutes the internal electrode 2 is exceeded when the internal electrode 2 is fired at 1100° C. This leads to coagulation of the electrically conductive material of the internal electrode 2 eventually resulting in delamination. In order to use a silver-palladium alloy having low palladium content as the electrically conductive material of the internal electrode 2, it is necessary to keep the firing temperature of the piezoelectric layer 1 to about 980° C. or lower.

The external electrode 4 consists of 80 to 99.5% by weight of the electrically conductive material that contains silver as the main component and 0.5 to 13% by weight of the glass component that contains lead oxide or bismuth oxide, while the glass component exists only in a region substantially not more than 80% in thickness of the external electrode 4 on the side of the surface of the stack 10. The external electrode 4 is bonded to the end of the internal electrode 2 that is exposed on the side face of the stack 10 through diffusion of the electrically conductive material in the external electrode 4, and is bonded to the side face of the stack 10 mainly via the glass component contained in the external electrode 4.

A method for manufacturing the multi-layer piezoelectric actuator comprising the multi-layer piezoelectric element of the present invention will now be described below.

According to this manufacturing method, the stack 10 is made similarly to the second embodiment, and grooves are formed one the side face of the stack 10 in every other layer by dicing apparatus or the like, as shown in FIG. 3A.

Then the external electrodes 4 are formed as follows.

87 to 99.5% by volume of silver powder having particle size in a range from 0.1 to 10 μm, 0.5 to 13% by volume of glass powder containing lead oxide or bismuth oxide having mean particle size in a range from 0.1 to 10 μm and a binder are mixed, so as to prepare a silver-glass paste for lower layer. A silver-glass paste for upper layer is prepared by adding a binder to silver powder having particle size in a range from 0.1 to 10 μm.

The silver-glass paste for lower layer 21a is applied to a release film by screen printing to a thickness of 5 to 40 μm. After drying, the silver-glass paste for lower layer 21b is applied thereto by screen printing to a thickness of 5 to 40 μm. After drying, the paste sheet 21 is peeled off the release film and is transferred onto the surface where the external electrode 4 is to be formed on the stack 10 that has the grooves formed thereon, so that the silver-glass paste for lower layer faces the stack 10. The external electrode 4 having the neck 4b formed thereon as shown in FIG. 3C is formed by baking at a temperature that is higher than the softening point of the glass contained in the silver-glass paste for lower layer and is not higher than the melting point of silver.

In order to effectively increase the silver content in the electrically conductive material of the internal electrode 2 toward the external electrode 4, integration with time (minute) of exponential function Y of temperature shown in equation 1 that represents the baking pattern of the external electrode 4 preferably gives a value of 1000 or more, preferably in a range from 1800 to 4000.

$$Y=\exp((T+273)/273) \text{ (T is in ° C.)} \quad \text{(Equation 1)}$$

When integration of Y with time (minute) is in a range from 1800 to 4000, it is made possible to effectively increase the silver content in the electrically conductive material of the internal electrode toward the external electrode 4, form the neck 4b in the joint between the internal electrode 2 and the external electrode 4 and form the glass-rich layer is formed on the surface of the external electrode 4 on the side thereof facing the stack 10.

The glass-rich layer can be formed on the surface of the external electrode 4 on the side thereof facing the stack 10 by baking the paste sheet 21 comprising the silver-glass paste for lower layer that contains the glass component and the silver-glass paste for upper layer that does not contain the glass component so that the silver-glass paste for lower layer is located on the stack 10 side. By controlling the thickness of the silver-glass paste for lower layer and the silver-glass paste for upper layer that form the paste sheet 21, the glass component can be caused to exist only in a region substantially not more than 80% in thickness of the external electrode 4 on the side of the surface of the stack 10. Moreover, the neck 4b can be formed by the baking operation, and cross diffusion of silver-palladium alloy in the internal electrode 2 and silver in the external electrode 4 occurs in the neck 4b. Thus palladium that has diffused from the internal electrode 2 can be detected by a common analytical method (for example, EPMA, EDS, etc.).

Method for forming the external electrode 4 is not limited to that described above, and the paste may also be printed directly on the external electrode 4 forming surface of the side face of the stack 10. While the external electrode 4 is formed in a single baking operation, the external electrode 4 may also be formed in two baking operations, by transferring or printing and then baking the silver-glass paste for lower layer and transferring or printing and then baking the silver-glass paste for upper layer.

Thickness of the external electrode 4 is preferably smaller than that of the piezoelectric layer 1, and more preferably 50 µm or less so as to be capable of deforming in conformity with the expansion and contraction of the stack that constitutes the actuator.

The reason for setting the composition of the silver-glass paste for lower layer in a range from 80 to 99.5% by weight of silver powder and 0.5 to 13% by weight of glass powder is as follows. When the content of the silver powder is less than 80% by weight, the external electrode 4 has high specific resistance that causes the external electrode 4 to undergo localized heating that leads to breakage if a large current flows. When the content of the silver powder is higher than 99.5% by weight, relatively low content of glass results in weaker bonding between the external electrode 4 and the stack 10, thus giving rise to the possibility of the external electrode 4 to come off the stack 10 during operation.

The silver-glass paste for upper layer does not contain glass component. This is because, when the lead wire 6 is connected to the external electrode 4 by soldering, existence of glass component in the surface of the external electrode 4 exposed to the atmosphere leads to lower wettability to solder and lower strength of bonding between the lead wire 6 and the external electrode 4, thus eventually causing the lead wire 6 to come off during operation.

Strength of bonding with the stack 10 can be increased by containing at least one of lead oxide and bismuth oxide in the glass component of the silver-glass paste for lower layer.

The multi-layer piezoelectric actuator of the second embodiment can be manufactured similarly to the first embodiment.

The stack 10 having the external electrodes 4 formed thereon is immersed in silicone rubber solution and is subjected to vacuum deaeration so as to fill the grooves of the stack 10 with the silicone rubber, and then the silicone rubber is cured.

Lead wires 6 are connected to the external electrodes 4, and DC voltage of 0.1 to 3 kV/mm is applied between the pair of external electrodes 4 via the lead wires 6 so as to apply polarization treatment to the stack 10, thereby to complete the multi-layer piezoelectric actuator that functions as a fuel injection valve for supplying fuel to an automobile engine.

In the first through third embodiments described above, the piezoelectric layer 1 is formed from a piezoelectric ceramic material constituted from perovskite type oxide such as lead titanate zirconate Pb(Zr, Ti)$O_3$ (hereinafter abbreviated as PZT) or barium titanate BaTi$O_3$ as the main component. The piezoelectric ceramic material preferably has high value of piezoelectric strain constant d33 which represents the piezoelectric characteristics.

In the first through third embodiments, thickness of the piezoelectric layer 1, namely the distance between the internal electrodes 2, is preferably in a range from 50 to 250 µm. This makes it possible to make the actuator smaller with low profile and prevent insulation breakdown of the piezoelectric layer 1 from occurring, even when a larger number of layers are stacked so as to achieve a greater amount of displacement of the multi-layer piezoelectric actuator by applying a voltage.

Figure 4A:
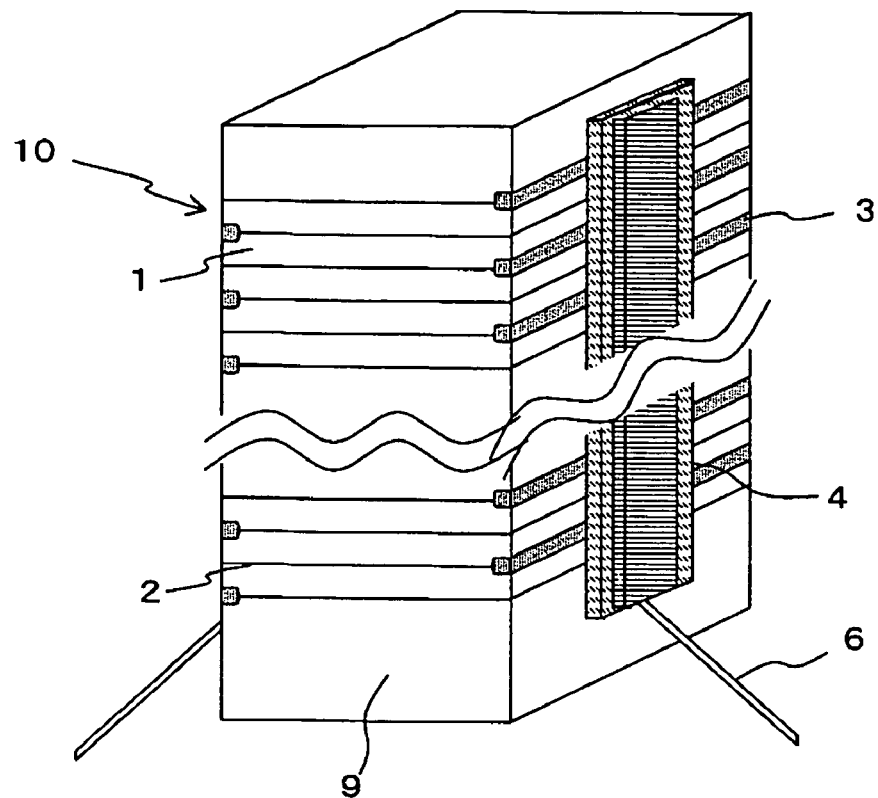
FIG. 4A is a perspective view of the multi-layer piezoelectric element according to the present invention where an electrically conductive assisting member is formed on the external surface of the external electrode.
Figure 4B:
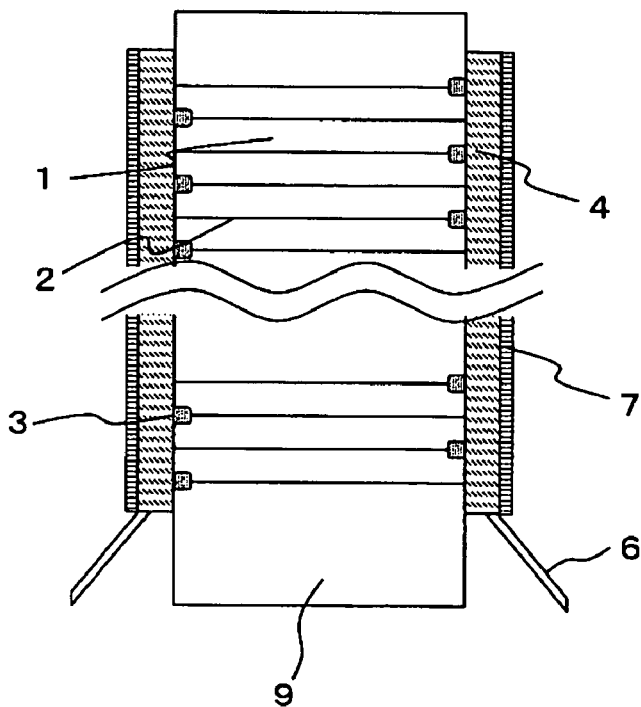
FIG. 4B is a sectional view of FIG. 4B.
Figure 4C:
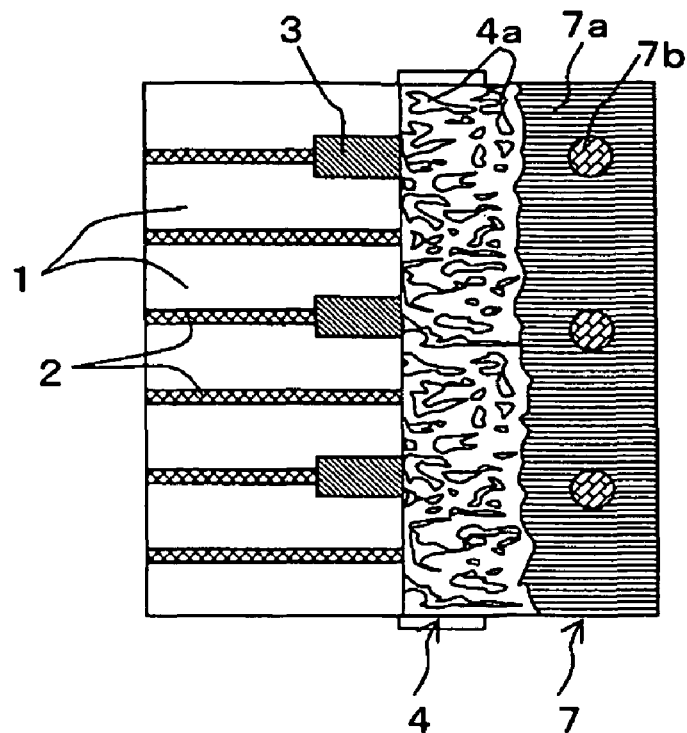
FIG. 4C is a sectional view showing enlarged part of FIG. 4B.

In the first through third embodiments, an electrical conductivity assisting member 7 made of an electrically conductive adhesive 7a with a metal mesh or a mesh-like metal sheet 7b embedded therein may be formed on the external surface of the external electrode 4 as shown in FIG. 4. In this case, the electrical conductivity assisting member provided on the external surface of the external electrode 4 allows it to supply a large electric current to the actuator, thereby enabling it to draw a large current through the electrical conductivity assisting member 7 even when operated at a high speed, thus reducing the current flowing in the external electrode 4. This makes it possible to prevent the external electrodes 4 from breaking due to localized heat generation, thus resulting in greatly improved reliability. Moreover, because the metal mesh or the mesh-like metal sheet 7b is embedded in the electrically conductive adhesive 7a, cracks can be prevented from occurring in the electrically conductive adhesive 7a.

In case a metal mesh or a mesh-like metal sheet is not used on the surface of the external electrode 4, the stress generated by the expansion and contraction of the stack 10 acts directly onto the external electrode 4, thus giving rise to the possibility of the external electrode 4 coming off the side face of the stack 10 due to fatigue during operation.

The metal mesh refers to a structure of entwined metal wires, and the mesh-like metal sheet refers to a metal sheet with a number of holes punched therethrough.

It is preferable that the electrically conductive adhesive is formed from polyimide resin that contains electrically conductive particles dispersed therein. Use of the polyimide resin that has high heat resistance makes it easier to maintain high bonding strength even when the stack 10 is used at high temperatures.

It is further preferable that the electrically conductive adhesive 7a that constitutes the electrically conductive assisting member 7 is formed from polyimide resin that contains silver powder which has low specific resistance dispersed therein. This is because the use of silver powder which has low specific resistance as the electrically conductive particles makes it easier to suppress the localized heat generation in the electrically conductive adhesive.

Furthermore, it is preferable that the electrically conductive particles are non-spherical particles such as flakes or acicular particles. When the electrically conductive particles are non-spherical particles such as flakes or acicular particles, the electrically conductive particles can be firmly entwined with each other, thereby increasing the shear strength of the electrically conductive adhesive 7a.

Fourth Embodiment

Figure 5:
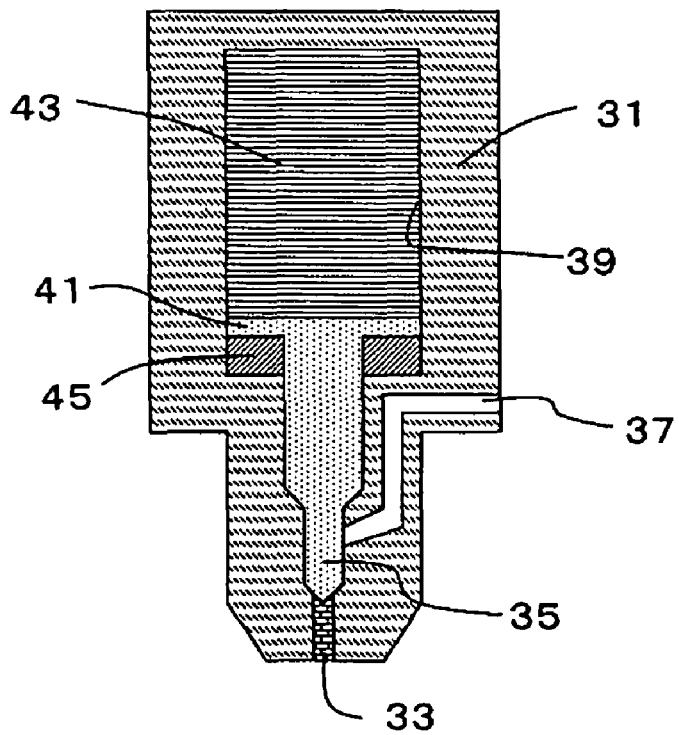
FIG. 5 is a sectional view showing the constitution of an injection apparatus according to fourth embodiment of the present invention.
Figure 6:
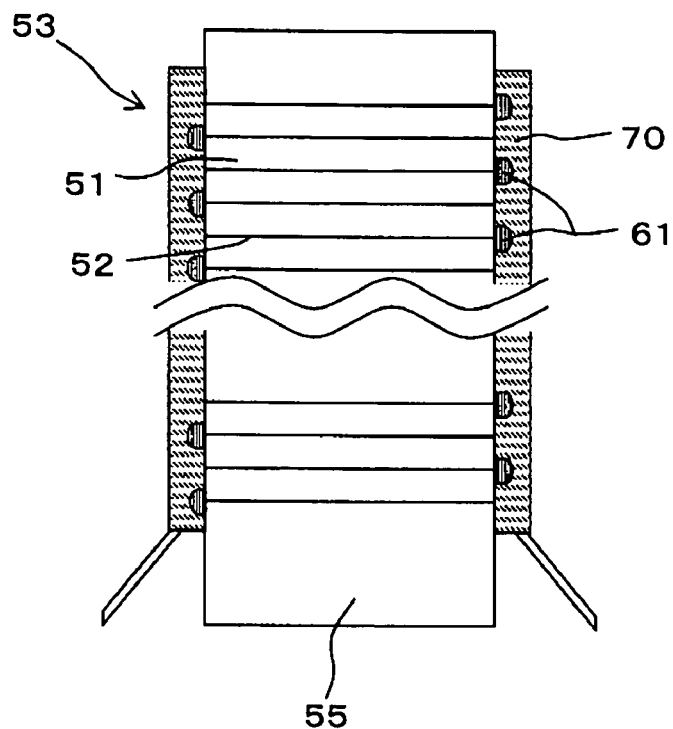
FIG. 6 is a sectional view of a multi-layer piezoelectric actuator of the prior art.
Figure 7:
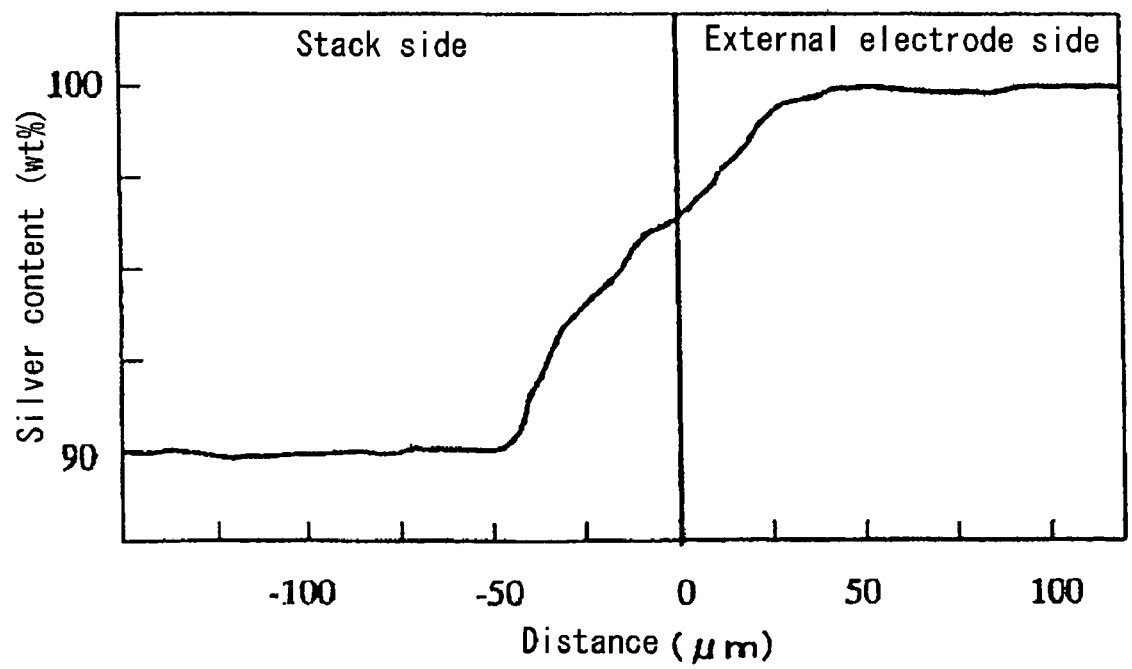
FIG. 7 is a graph showing the proportion of silver content in electrically conductive material of the internal electrode according to the fourth embodiment of the present

FIG. 5 is a sectional view showing the constitution of an injection apparatus according to fourth embodiment of the present invention, constituted from the piezoelectric actuator of the present invention. In FIG. 5, reference numeral 31 denotes a container. The container 31 has an injection hole 33 formed at one end thereof, and a needle valve 35 housed therein to open and close the injection hole 33.

The injection hole 33 is provided with a fuel passage 37 in communication therewith. The fuel passage 37 is connected to a fuel source that is provided outside of the apparatus, so as to receive supply of fuel at a constant pressure. When the needle valve 35 opens the injection hole 33, the fuel that fills the fuel passage 37 is injected at a predetermined level of high pressure into a fuel chamber of an internal combustion engine that is not shown in the drawings.

The needle valve 35 has an enlarged top portion of large diameter so as to serve as a piston 41 that makes sliding motion in a cylinder 39 formed in the container 31. The piezoelectric actuator 43 is housed in the container 31.

The piezoelectric actuator 43 is the piezoelectric actuator of the present invention.

With the injection apparatus as described above, when the piezoelectric actuator 43 is caused to expand by a voltage applied thereto, the piston 41 is pressed so that the needle valve 35 plugs the injection hole 33 and shuts off the fuel supply. When the voltage is removed, the piezoelectric actuator 43 contracts and a Belleville spring 45 presses back the piston 41 so that the injection hole 33 communicates with the fuel passage 37 thereby allowing the fuel to be injected.

With this injection apparatus, since the internal electrode and the external electrode of the multi-layer piezoelectric element can be prevented from breaking and durability can be greatly improved as described in the first through third embodiments, durability of the injection apparatus can also be improved.

Example 1

In Example 1, the stack was made, with the piezoelectric layers formed from PZT having thickness of 150 μm and the internal electrodes from silver-palladium alloy (10% by weight of Pd included) having thickness of 3 μm, by stacking 300 layers each of the piezoelectric layers and the internal electrodes. The stack was fired at 1000° C.

Then a groove measuring 50 μm in depth and 50 μm width was formed at the end of the internal electrode on the side face of the column-shaped stack in every other layer by a dicing apparatus, as shown in FIG. 3A.

Then 90% by volume of silver powder of flake-like particles having mean particle size of 2 μm and 10% by volume of amorphous glass powder having softening point of 640° C. containing silicon as the main component having mean particle size of 2 μm were mixed, and 8 weight parts of a binder was added for 100 weight parts in total of the silver powder and the glass powder, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet as measured by Archimedes method was 6.5 g/cm$^3$.

The sheet of electrically conductive silver-glass paste was transferred onto the external electrode surface of the stack as shown in FIG. 3B and was baked at 650° C. for 30 minutes, thereby forming the external electrode from the porous electrically conductive material having three-dimensional mesh structure as shown in FIG. 3C. Measurement of the void ratio of the external electrode by means of image analysis apparatus on a photograph of a cut surface of the external electrode showed a void ratio of 40%. Analysis by Electron Probe Micro Analysis (EPMA) showed junction was formed through cross diffusion of silver included in the electrically conductive silver-glass paste and silver-palladium alloy in the internal electrode and the neck was formed through diffusion of palladium from the internal electrode at the junction with the internal electrode. Further, measurement on section photograph of the external electrode showed that void ratio in the junction between the external electrode and the side face of the stack was about 50%.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator as shown in FIG. 1.

When a DC voltage of 170 V was applied to the multi-layer piezoelectric actuator made as described above, displacement of 45 μm was observed in the direction of stacking. Operation test was conducted on this actuator by applying an AC voltage varying between 0 V and +170 V at frequency of 150 Hz at room temperature to undergo 2×10$^8$ cycles of operation, and displacement of 45 μm was observed with no abnormality in the external electrodes being observed. A multi-layer piezoelectric actuator was made similarly to the above except for varying the density of the green electrically conductive silver-glass paste and forming external electrodes having void ratio of 30% by volume and 70% by volume. When the multi-layer piezoelectric actuator was operated to undergo 2×10$^8$ cycles, displacement of 45 μm was observed and no abnormality in the external electrodes was observed.

Comparative Example 1

A multi-layer piezoelectric actuator was made with constitution similar to that to that of Example, except for applying the green electrically conductive silver-glass paste to the side face of the stack and drying (density 9.1 g/cm$^3$) with the baking temperature changed to 820° C. In this case, the external electrodes were not formed in three-dimensional mesh structure, but were formed in bulk having spherical voids with voids ratio of 10%, and were bonded onto the side face of the stack over the entire surface.

Operation test was conducted on this actuator by applying an AC voltage varying between 0 V and +170 V at frequency of 150 Hz similarly to Example, and the external electrode was broken after 5×10$^6$ cycles of operation and spark occurred.

Example 2

In Example 2, the multi-layer piezoelectric element of the present invention was made as described below.

First, a slurry was prepared by mixing a calcined powder of piezoelectric ceramics containing PZT as the main component, a binder and a plasticizer, and the slurry was formed into a ceramic green sheet that would become the piezoelectric layer 1 having thickness of 150 μm by doctor blade method.

Then an electrically conductive paste, prepared by adding a binder to the silver-palladium alloy comprising a mixture of 85 to 95% by weight of silver and palladium, was applied to one side of the ceramic green sheet to a thickness of 3 μm by screen printing process. Then 300 pieces of the ceramic green sheets were stacked and fired at a temperature of 980 to 1100° C., thereby to obtain the stack 10 shown in FIG. 1.

Then a groove measuring 50 μm in depth and 50 μm in width was formed at the end of the internal electrode 2 located on the side face of the stack 10 in every other layer, by means of a dicing apparatus, as shown in FIG. 3A.

Then 84 to 97% by weight (Y %) of silver powder of flake-like particle shape having mean particle size of 2 μm and amorphous glass powder having softening point of 640° C. containing silicon as the main component having mean particle size of 2 μm were mixed, and 8 weight parts of a binder was added for 100 weight parts in total of the silver powder and the glass powder, so as to prepare the electrically conductive silver-glass paste by mixing the powders. The electrically conductive silver-glass paste thus prepared was screen printed onto a release film. After drying, the paste film was peeled off the release film to obtain a sheet of the electrically conductive silver-glass paste. The sheet of electrically conductive silver-glass paste was transferred onto a pair of opposing side faces of the stack 10 and was bonded by baking at 650° C. for 30 minutes, thereby forming the external electrode 4.

In the junction between the internal electrode and the external electrode 4, the neck 4b is formed through cross diffusion of the silver-palladium alloy contained in the internal electrode 2 and silver contained in the electrically conductive silver-glass paste of the external electrode 4. Analysis of the neck 4b by EPMA showed that palladium had diffused from the internal electrode 2.

Measurement on a section photograph of the external electrode 4 showed that void ratio in the internal electrode 2 formed as described above was 40%. Further measurement on section photograph of the external electrode 4 showed that void ratio in the junction between the external electrode 4 and the side face of the stack 10 was about 50%. It was also found that a glass-rich layer was formed on the surface of the external electrode 4 on the piezoelectric layer side wherein the glass component of the electrically conductive silver-glass paste was concentrated.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator as shown in FIG. 1.

In the multi-layer piezoelectric actuator of the present invention made as described above, the proportion X (% by weight) of silver in the electrically conductive material of the internal electrode 2 and the proportion Y (% by weight) of silver in the external electrode were controlled to satisfy conditions of $X \geq 85$, and the operation of the multi-layer piezoelectric actuator was studied in relation to the value of X/Y.

As comparative examples, samples were made with the value of X/Y controlled to satisfy X/Y<0.9 or X/Y>1.1.

When a DC voltage of 185 V was applied to the multi-layer piezoelectric actuator that was made as described above, displacement of 49 μm was observed in the direction of stacking in all of the multi-layer piezoelectric actuators. Operation test was conducted on these multi-layer piezoelectric actuators by applying an AC voltage varying between 0 V and +185 V at frequency of 150 Hz at room temperature to undergo $2 \times 10^8$ cycles of operation. The results are shown in Table 1.

TABLE 1

| Sample No. | Proportion X of silver by weight in internal electrode | Proportion Y of silver by weight in external electrode | Ratio X/Y | Evaluation (After $2 \times 10^8$ cycles) |
|---|---|---|---|---|
| 1 | 95 | 97 | 0.98 | No abnormality |
| 2 | 95 | 86.5 | 1.1 | No abnormality |
| 3 | 88 | 97.5 | 0.9 | No abnormality |
| *4 | 85 | 97 | 0.88 | Amount of displacement decreased. |
| *5 | 95 | 84 | 1.13 | Amount of displacement decreased. |

From Table 1, it can be seen that, in sample No. 4 that was a comparative example where the value of X/Y was less than 0.9 resulting in the silver content in the internal electrode 2 lower than that of the external electrode 4 and higher melting point of the internal electrode 2 due to less silver content in the internal electrode 2, less cross diffusion of silver between the internal electrode 2 and the external electrode 4 occurred leading to lower strength of the neck 4b. As a result, when the multi-layer piezoelectric actuator was operated continuously at a high speed, the neck 4b was broken due to the stress generated by the expansion and contraction of the stack 10 thus shutting off the current supply to part of the piezoelectric layers 1. Consequently, the amount of displacement of the stack 10 decreased as the number of operation cycles increased, thus showing lower durability of the multi-layer piezoelectric actuator.

In sample No. 5 that was a comparative example where value of X/Y was higher than 1.1 resulting in the silver content in the external electrode 4 lower than the silver content in the electrically conductive material of the internal electrode 2, less cross diffusion of silver between internal electrode 2 and the external electrode 4 occurred. As a result, the neck 4b was broken due to the stress generated by the expansion and contraction of the stack 10 thus shutting off the current supply to part of the piezoelectric layers 1, similarly to the sample described above. Consequently, the amount of displacement of the stack 10 decreased as the number of operation cycles increased, thus showing lower durability of the multi-layer piezoelectric actuator.

In samples Nos. 1 through 3 that were multi-layer piezoelectric actuators of the present invention where silver content was controlled so as to satisfy the conditions of $X \geq 85$ and $0.9 \leq X/Y \leq 1.1$, cross diffusion of silver between the internal electrode 2 and the external electrode 4 was accelerated so as to form firm bonding between the internal electrode 2 and the external electrode 4. As a result, displacement of 49 μm was observed after $2 \times 10^8$ cycles of operation and no trouble such as spark or breakage was observed in the external electrode $2 \times 10^8$ cycles of operation. Thus the multi-layer piezoelectric actuator showed excellent durability.

Example 3

In Example 3, multi-layer piezoelectric actuators were made by using the internal electrodes 2 formed from an electrically conductive paste prepared by adding calcined powder of piezoelectric material to the silver-palladium alloy, while controlling the proportion Z (% by weight) of silver in the internal electrode 2 containing the electrically conductive material and the piezoelectric material, the proportion Y (% by weight) of silver in the external electrode 4 and the proportion Z (% by weight) of silver in the internal electrode 2, and operation of the multi-layer piezoelectric actuator was checked in relation to the value of Z/Y. Manufacturing method was similar to that of Example 2.

When a DC voltage of 185 V was applied to the multi-layer piezoelectric actuator made as described above, displacement of 49 μm was observed in the direction of stacking in all samples. Operation test was conducted on these multi-layer piezoelectric actuators by applying an AC voltage varying within a range from 0 V and +185 V at frequency of 150 Hz at room temperature to undergo $5 \times 10^8$ cycles of operation. The results are shown in Table 2.

TABLE 2

| Sample No. | Proportion Z of silver by weight in internal electrode | Proportion Y of silver by weight in external electrode | Ratio Z/Y | Evaluation (After $5 \times 10^8$ cycles) |
|---|---|---|---|---|
| 6 | 80 | 97 | 0.82 | No abnormality |
| 7 | 86.5 | 86.8 | 1 | No abnormality |
| 8 | 68.5 | 97.5 | 0.7 | No abnormality |
| 9 | 90 | 84 | 1.07 | Amount of displacement decreased. |
| 10 | 63 | 96 | 0.66 | Amount of displacement decreased from start. |

From Table 2, it can be seen that, in sample No. 9 where value of Z/Y was higher than 1.0 resulting in less content of the piezoelectric material in the internal electrode 2 and weaker bonding between the internal electrode 2 and the piezoelectric layer 1. As a result, part of the internal electrode 2 and the piezoelectric layer 1 peeled off thus shutting off the current supply to part of the piezoelectric layers 1. Consequently, the amount of displacement decreased.

In sample No. 10 where value of Z/Y was less than 0.7 resulting in less content of the silver in the internal electrode 2 and higher resistance of the external electrode 4 than that of the internal electrode 2. As a result, when operated continuously with a high frequency, the piezoelectric layer 1 could not be supplied with sufficient voltage due to the voltage drop caused by the high resistance of the internal electrode, and the amount of displacement decreased.

In samples Nos. 6 through 8, displacement of 49 μm was observed after $5 \times 10^8$ cycles of operation and no trouble such as breakage in the junction between internal electrode 2 and the external electrode 4 was observed.

Example 4

The multi-layer piezoelectric actuator comprising the multi-layer piezoelectric element of the present invention was made as described below.

First, the stack 10 shown in FIG. 1 was made similarly to Example 5, and a groove measuring 50 μm in depth and 50 μm in width was formed at the end of the internal electrode 2 located on the side face of the stack 10 in every other layer, by means of a dicing apparatus, as shown in FIG. 3A.

Then 80 to 99.5% by weight of silver powder having mean particle size of 2 μm and glass powder containing at least one of lead oxide and bismuth oxide having mean particle size of 2 μm were mixed, and a binder was added so as to prepare the silver-glass paste for lower layer. The silver-glass paste for upper layer was prepared similarly by adding a binder to the silver powder having mean particle size of 2 μm.

The silver-glass paste for lower layer was applied to a release film by screen printing to a thickness of 5 to 40 μm. After drying, the silver-glass paste for upper layer was applied thereto by screen printing to a thickness of 5 to 40 μm. After drying, the paste sheet was peeled off the release film and was transferred onto the pair of opposing side faces of the stack 10 so that the silver-glass paste for lower layer faces the surface of the stack 10, and was baked at 800° C. for 30 minutes, thereby forming the external electrode 4. Integration of Y in equation 1 with time (minute) gave a value of 3240.

Quantitative analysis of elements in the internal electrode 2 was conducted along line X shown in FIG. 2B by EPMA. It was found that silver content in the electrically conductive material of the internal electrode 2 gradually increased from a point 50 μm short of the junction with the external electrode 4 toward the junction with the external electrode 4 as shown in FIG. 5.

In the joint between the internal electrode 2 and the external electrode 4, the neck 4b was formed through cross diffusion of the silver-palladium alloy contained in the internal electrode 2 and silver contained in the external electrode 4. Analysis of the neck 4b by EPMA showed that palladium had diffused from the internal electrode 2.

It was also found that a glass-rich layer was formed on the surface of the external electrode 4 on the piezoelectric layer side wherein the glass component was concentrated. The glass component existed in a region substantially not more than 60% in thickness of the external electrode 4 on the side of the surface of the stack 10.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator as shown in FIG. 1.

Example 5

In Example 5, several kinds of multi-layer piezoelectric actuator were made by a manufacturing method similar to that of Example 4, except for altering the kind of electrically conductive paste used to form the external electrode 4 and the temperature of baking thereof. The multi-layer piezoelectric actuator thus obtained was analyzed to determine the ratio of silver content in the vicinity of the junction between the electrically conductive material of the internal electrode 2 and the external electrode 4 to silver content in the stack 10. When a DC voltage of 185 V was applied to the multi-layer piezoelectric actuator made as described above, displacement of 49 μm was observed in the direction of stacking in all of the multi-layer piezoelectric actuators. Operation test was conducted on these multi-layer piezoelectric actuators by applying an AC voltage varying between 0 V and +185 V at frequency of 150 Hz at room temperature to undergo $2 \times 10^8$ cycles of operation. The results are shown in Table 3.

TABLE 3

| Sample No. | Proportion of silver in internal electrode | | Ratio of silver content (E/I) | Evaluation (After $2 \times 10^8$ cycles) |
|---|---|---|---|---|
| | Inside stack (I %) | Near junction with external electrode (E %) | | |
| 11 | 95 | 98 | 1.03 | No abnormality |
| 12 | 85 | 95 | 1.12 | No abnormality |
| *13 | 95 | 95 | 1.00 | Amount of displacement decreased. |

From Table 3, it can be seen that in sample No. 13, where the ratio of silver content in the vicinity of the junction between the electrically conductive material of the internal electrode 2 and the external electrode 4 to silver content in the stack 10 is not higher than 1, that is, the silver content in the vicinity of the junction between the electrically conductive material of the internal electrode 2 and the external electrode 4 is not higher than the silver content in the electrically conductive material of the internal electrode 2 inside of the stack 10, bonding in the junction between the internal electrode and the external electrode is weak. As a result, part of the junction between the internal electrode 2 and the external electrode 4 comes off leading to failure of power supply to part of the piezoelectric layers 1 and lower displacement characteristic.

In samples Nos. 11 and 12 that are examples of the present invention, where the silver content in the electrically conductive material of the internal electrode in the vicinity of the junction with the external electrode 4 is higher than the silver content in the electrically conductive material of the internal electrode 2 inside of the stack 10, bonding in the junction between the internal electrode 2 and the external electrode 4 is strong and displacement of 49 μm was achieved after $2 \times 10^8$ cycles. Moreover, no trouble such as spark or breakage was observed in the external electrode $2 \times 10^8$ cycles of operation. Thus the multi-layer piezoelectric actuator showed excellent durability.

Example 6

In Example 6, several kinds of multi-layer piezoelectric actuator were made while varying the kind of electrically conductive paste used to form the external electrode 4 and the temperature of baking thereof. Sample No. 16 did not have glass-rich layer on the surface of the external electrode 4 facing the surface of the stack 10, and sample No. 17 contained glass component in a region up to 95% of the thickness of the external electrode 4 from the surface of the stack. When a DC voltage of 185 V was applied to the multi-layer piezoelectric actuator made as described above, displacement of 49 μm was observed in the direction of stacking in all of the multi-layer piezoelectric actuator. Operation test was conducted on these multi-layer piezoelectric actuators by applying an AC voltage varying between 0 V and +185 V at frequency of 150 Hz at room temperature to undergo $5 \times 10^8$ cycles of operation. The results are shown in Table 4.

TABLE 4

| Sample No. | Glass-rich | Distribution of glass component | Evaluation (After $5 \times 10^8$ cycles) |
| --- | --- | --- | --- |
| 14 | Present | Within 60% | No abnormality |
| 15 | Present | Within 80% | No abnormality |
| *16 | None | Within 60% | Amount of displacement decreased. |
| *17 | Present | Within 95% | Lead wire came off. |

From Table 4, it can be seen that, in sample No. 16 that did not have glass-rich layer on the surface of the external electrode 4 facing the surface of the stack 10, bonding in the junction between the external electrode 4 and the stack 10 was weak. As a result, the external electrode 4 came off the stack 10 during operation, leading to failure of power supply to part of the piezoelectric layer 1 and lower displacement characteristic. In sample No. 17 where glass component existed in a region up to 95% of the thickness of the external electrode 4 from the surface of the stack, bonding of the solder that fastened the lead wire 6 onto the external electrode 4 was weak, and the lead wire 6 came off during operation.

In samples Nos. 14 and 15, displacement of 49 μm was achieved after $5 \times 10^8$ cycles of operation, and no trouble such as breakage of the junction between the internal electrode 2 and the external electrode 4 occurred.

INDUSTRIAL APPLICABILITY

The multi-layer piezoelectric element of the present invention can be used as a piezoelectric transducer. The multi-layer piezoelectric element of the present invention can also be used as a multi-layer piezoelectric actuator for fuel injection apparatus of automobile engine, drive unit used in precision positioning device or vibration preventing device for an optical apparatus or the like. The multi-layer piezoelectric element of the present invention can also be used for liquid injection apparatus for automobile fuel and ink of ink jet printer or the like.

The invention claimed is:

1. A multi-layer piezoelectric element comprising a stack formed by stacking piezoelectric layers and internal electrodes alternately one on another and external electrodes formed on a first side face and on a second side face of the stack, one of the adjacent internal electrodes being connected to the external electrode formed on the first side face and the other internal electrode being connected to the external electrode formed on the second side face, the internal electrodes being made of an electrically conductive material that contains silver as the main component and at least one of palladium and platinum, the external electrodes being made of a conductive material including silver as a main component and glass, wherein the proportion of silver contained in electrically conductive material of the internal electrode near the junction with the external electrode is higher than the proportion of silver contained in electrically conductive material of the internal electrode located inside of the stack.

2. The multi-layer piezoelectric element according to claim 1, wherein the proportion of silver contained in electrically conductive material of the internal electrode becomes higher toward the external electrode.

3. The multi-layer piezoelectric element according to claim 1, wherein the proportion of silver contained in the electrically conductive material of the internal electrode is 85% by weight or higher.

4. The multi-layer piezoelectric element according to claim 1, wherein the glass component contained in the external electrode exists in a region substantially not more than 80% in thickness of the external electrode on the side of the surface of the stack.

5. The multi-layer piezoelectric element according to claim 1, wherein the glass component contained in the external electrode contains lead oxide or bismuth oxide.

6. The multi-layer piezoelectric element according to claim 1, wherein the external electrode and the internal electrode are joined by diffusion.

7. The multi-layer piezoelectric element according to claim 1, wherein a glass-rich layer is formed on the surface of the external electrode on the side thereof facing the piezoelectric layer.

8. The multi-layer piezoelectric element according to claim 1, wherein a thickness of the external electrode is smaller than a thickness of the piezoelectric layer that constitutes the stack.

9. The multi-layer piezoelectric element according to claim 1,
wherein a groove is formed between the end of the other internal electrode and the external electrode on the first side face, with the groove being filled with an insulating material and a groove is formed between the end of the one internal electrode and the external electrode on the second side face, with the groove being filled with an insulating material, the insulating material having Young's modulus lower than that of the piezoelectric material.

10. The multi-layer piezoelectric element according to claim 1, further comprising an electrically conductive assisting member formed from an electrically conductive adhesive, containing a metal mesh or a mesh-like metal sheet embedded therein, on the external surface of the external electrode.

11. The multi-layer piezoelectric element according to claim 10,
wherein the electrically conductive adhesive is polyimide resin having electrically conductive particles dispersed therein.

12. The multi-layer piezoelectric element according to claim 11,
wherein the electrically conductive particles are silver particles.

* * * * *